US010847636B2

(12) United States Patent
Tsai et al.

(10) Patent No.: US 10,847,636 B2
(45) Date of Patent: Nov. 24, 2020

(54) METHODS FOR FORMING SEMICONDUCTOR STRUCTURE

(71) Applicant: TAIWAN SEMICONDUCTOR MANUFACTURING COMPANY LTD., Hsinchu (TW)

(72) Inventors: Chun Hsiung Tsai, Hsinchu County (TW); Ru-Shang Hsiao, Hsinchu County (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/397,577

(22) Filed: Apr. 29, 2019

(65) Prior Publication Data

US 2020/0075748 A1   Mar. 5, 2020

Related U.S. Application Data

(60) Provisional application No. 62/724,898, filed on Aug. 30, 2018.

(51) Int. Cl.
*H01L 29/66* (2006.01)
*H01L 21/306* (2006.01)
(Continued)

(52) U.S. Cl.
CPC .. *H01L 29/66795* (2013.01); *H01L 21/02057* (2013.01); *H01L 21/30604* (2013.01); *H01L 29/66545* (2013.01); *H01L 29/785* (2013.01)

(58) Field of Classification Search
CPC ......... H01L 29/66795; H01L 29/66545; H01L 21/02057; H01L 29/785
See application file for complete search history.

(56) References Cited

U.S. PATENT DOCUMENTS 6,740,247 B1 * 5/2004 Han ................... H01L 21/02049
216/73
8,492,839 B2 * 7/2013 Doris ................. H01L 27/1211
257/347

(Continued)

OTHER PUBLICATIONS

FYuaka Nakazawa et al., "Selective ETching of Silicon Native Oxide with Remote-Plasma_Excited Anhydrous Hydrogen Fluoride", Japanese Journal of Applied Physics, vol. 37, pp. L536-L538, Part 2, No. 5A, May 1, 1998 (Year: 1998).*

(Continued)

*Primary Examiner* — William Coleman
(74) *Attorney, Agent, or Firm* — WPAT, P.C., Intellectual Property Attorneys; Anthony King

(57) ABSTRACT

A method for forming a semiconductor structure is provided. The method includes the following operations. A substrate is received. The substrate includes a fin structure, a semiconductor layer over the fin structure, and a dielectric layer sandwiched between the fin structure and the semiconductor layer. The semiconductor layer is patterned to form a sacrificial gate layer over a portion of the fin structure. A first cleaning operation is performed with a HF solution. Spacers are formed over sidewalls of the sacrificial gate layer. Recesses are formed in the fin structure at two sides of the sacrificial gate layer. A second cleaning operation is performed with an HF-containing plasma.

20 Claims, 26 Drawing Sheets

(51) Int. Cl.
  *H01L 21/02* (2006.01)
  *H01L 29/78* (2006.01)

(56) References Cited

U.S. PATENT DOCUMENTS

| 9,018,087 | B2 * | 4/2015 | Shih | H01L 21/30621 |
| | | | | 438/595 |
| 9,876,077 | B1 * | 1/2018 | Xie | H01L 27/0886 |
| 10,283,615 | B2 * | 5/2019 | Yang | H01L 21/02068 |
| 10,586,868 | B2 * | 3/2020 | Kim | H01L 29/16 |

OTHER PUBLICATIONS

Ito et al., "Effects of hydrogen on plasma etching for silicon and silicon nitride", International Symposium on Plasma Chemistry, 21st International Symposium on Plasma Chemistry, Sunday Aug. 4-Friday Aug. 9, 2013, Cairns Convention Centre, Queensland, Australia (Poster, symposium) (Year: 2013).*

* cited by examiner

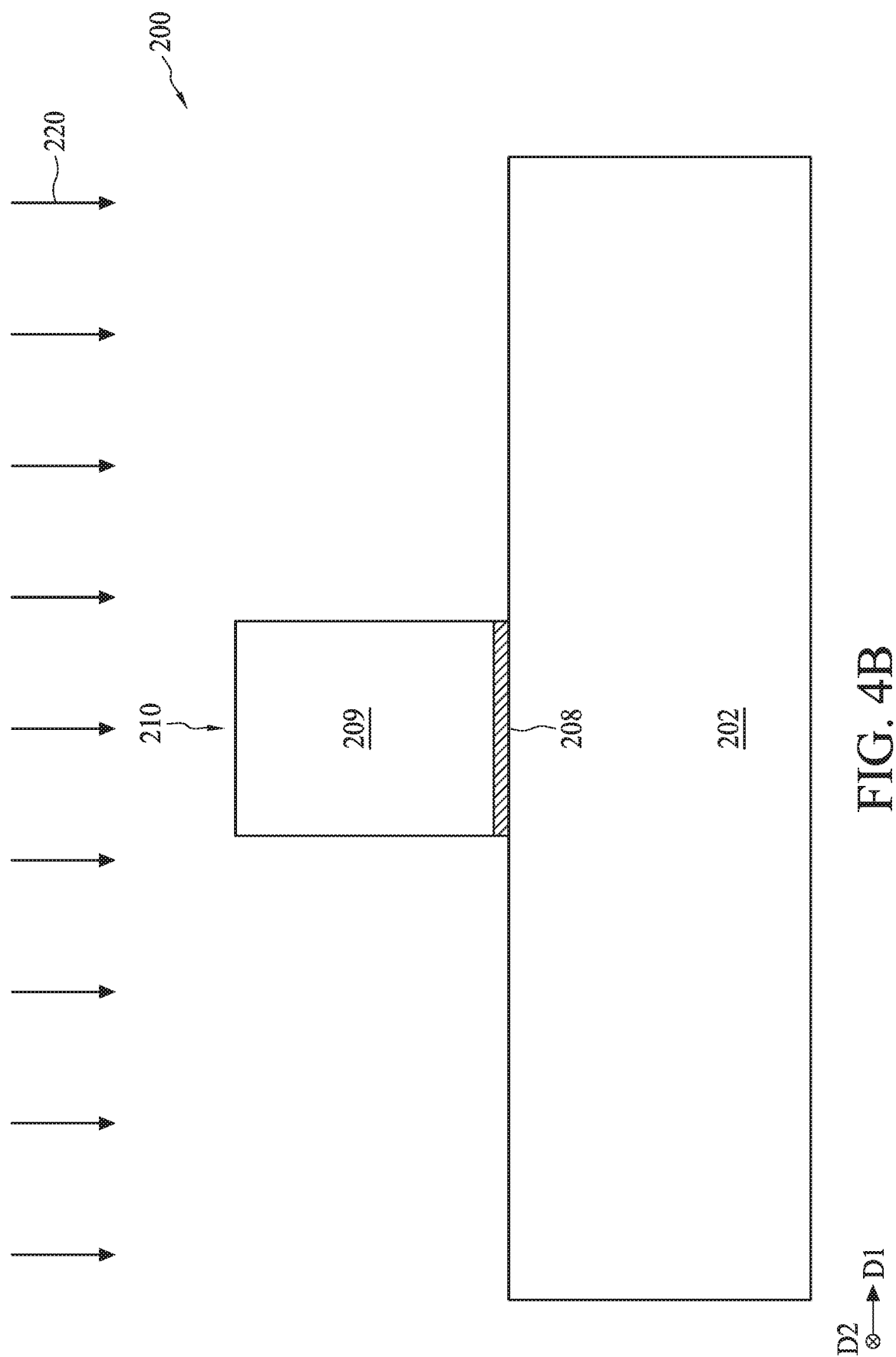

METHODS FOR FORMING SEMICONDUCTOR STRUCTURE

PRIORITY DATA

This patent claims the benefit of U.S. Provisional Patent Application Ser. No. 62/724,898 filed Aug. 30, 2018, the entire disclosure of which is hereby incorporated by reference.

BACKGROUND

Metal-oxide-semiconductor (MOS) devices are basic building elements in integrated circuits. An existing MOS device typically has a gate electrode comprising polysilicon doped with p-type or n-type impurities, using doping operations such as ion implantation or thermal diffusion. The work function of the gate electrode may be adjusted to the band-edge of the silicon. For an n-type metal-oxide-semiconductor (NMOS) device, the work function may be adjusted nearly that of the conduction band of silicon. For a P-type metal-oxide-semiconductor (PMOS) device, the work function may be adjusted to close to nearly that of the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, whereas in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to suit to the requirements of the NMOS and PMOS devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2B, 3B, 4B, 5B and 6B are cross-sectional views taken along a line I-I' of FIGS. 2A, 3A, 4A, 5A and 6A, respectively, according to aspects of the present disclosure in one or more embodiments.

DETAILED DESCRIPTION

Figure 1:
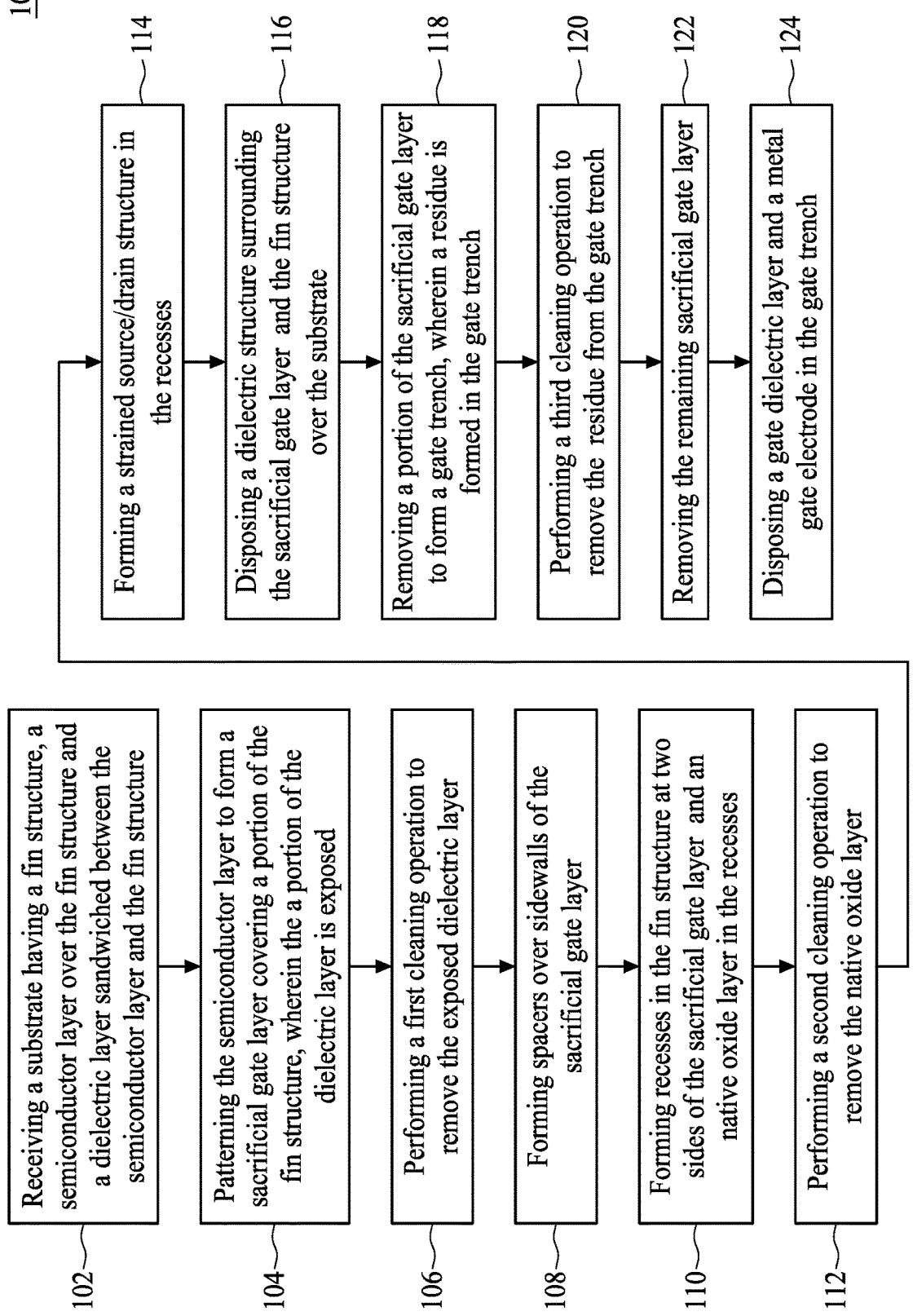
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range can be contemplated by people having ordinary skill in the art. Alternatively, the terms "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As technology nodes achieve progressive smaller scales, in some integrated circuit (IC) designs, researchers have hoped to replace the typical polysilicon gate with a metal gate to improve device performance with the decreased feature sizes. One approach of forming the metal gate is called a "gate-last" approach, sometimes referred to as replacement polysilicon gate (RPG) approach. In an RPG approach, the metal gate is fabricated last, which allows for a reduced number of subsequent operations. However, the RPG approach is a complicated approach, and many issues arise.

For example, with a high-k metal gate last (HKMG) operation, an operation of patterning the polysilicon gate (sometimes referred to as dummy gate) in order to define location and dimension of the desired metal gate is required. However, it is found that some polysilicon may remain over corners between the polysilicon gate and the fin structure, and the polysilicon residue, known as the "footing", of the sacrificial gate layer may cause metal extrusion issues. In some comparative embodiments, the footing of the sacrificial gate layer may cover the pad dielectric layer over the fin structure and obstruct it from being removed. Further, in some embodiments, when a strained source/drain is required, recesses may be formed in the fin structure at two sides of the sacrificial gate layer and the spacer, and an oxide cleaning operation is subsequently performed. During the oxide cleaning operation, the pad dielectric layer under the footing of the sacrificial gate layer may be consumed and thus a channel may be formed under the footing of the dummy gate. Not only is the pad dielectric layer under the footing of the sacrificial gate layer consumed, but the spacer over the footing of the sacrificial gate layer is also etched during the oxide cleaning operation, and thus a void may be formed. In this case, the channel and the void may be filled with the materials used to form the metal gate, resulting in a metal gate extrusion issue. The extrusion of the metal gate may be very close to an extending portion of the source/drain. As result, short circuiting may occur and the production yield of the semiconductor structure manufacturing process may be reduced.

In addition, when the polysilicon sacrificial gate layer is replaced with the metal gate, another issue is raised. For example, during the removal of the polysilicon dummy gate, two etching operations may be used with a dry etching performed prior to a wet etching. However, it is found that residue left by the dry etching becomes etchant in the wet etching, and such etchant removes the pad dielectric layer, which originally covers the fin structure. Unfortunately, the removal of the pad dielectric layer may form a channel, and the channel may be filled with the materials used to form the metal gate, resulting in another metal gate extrusion issue. As mentioned above, the extrusion of the metal gate may be very close to the extending portion of the source/drain, and short circuiting may occur, reducing the production yield of the semiconductor structure manufacturing process. In some case, the pad dielectric layer may be entirely consumed and thus the substrate or fin structures are exposed and etched in the wet etching operation. In other words, the sacrificial gate layer removal operation suffers from reduced controllability.

Embodiments of a method for forming a semiconductor structure are therefore provided. The semiconductor structure is formed in an RPG or gate-last process in accordance with the embodiments. The semiconductor structure can be formed in a planar device process according to some embodiments. The semiconductor structure can be formed in a non-planar device in alternative embodiments. In some embodiments, the method for forming the semiconductor structure includes introducing a wet cleaning operation in order to remove the pad dielectric layer after the forming of a sacrificial gate layer (also referred to as the dummy gate). In some embodiments, the method for forming the semiconductor structure includes introducing a dry cleaning operation with higher selectivity in order to prevent the spacer from being consumed. Accordingly, the channel and the void caused by the footing of the sacrificial gate layer can be mitigated. In some embodiments, the method for forming the semiconductor structure includes introducing a dry cleaning operation to remove residue between the two etchings of the removal operation of the sacrificial gate layer, such that the residue functioning as an etchant can be cleaned away. Accordingly, consumption of the pad dielectric layer during the removal of the sacrificial gate layer is mitigated. Briefly speaking, the method for forming the semiconductor structure mitigates the metal gate extrusion issue, and thus the production yield of the semiconductor structure manufacturing process is improved.

FIG. 1 is a flowchart representing a method for forming a semiconductor structure according to aspects of the present disclosure. The method for forming a semiconductor structure 10 includes an operation 102 where a substrate is received. In some embodiments, a semiconductor layer is formed over the substrate, and a dielectric layer is sandwiched between the semiconductor layer and the substrate. In some embodiments, the substrate includes a fin structure, a semiconductor layer over the fin structure and a dielectric layer sandwiched between the semiconductor layer and the fin structure. The method 10 further includes an operation 104 where the semiconductor layer is patterned to form a sacrificial gate layer. In some embodiments, the sacrificial gate layer covers a portion of the fin structure, and a portion of the dielectric layer is exposed through the sacrificial gate layer. The method 10 further includes an operation 106 where a first cleaning operation is performed to remove the exposed dielectric layer. The method 10 further includes an operation 108 where spacers are formed over sidewalls of the sacrificial gate layer. The method 10 further includes an operation 110 where recesses are formed at two sides of the sacrificial gate layer. In some embodiments, the recesses are formed in the substrate at the two sides of the sacrificial gate layer. In other embodiments, the recesses are formed in the fin structure at the two sides of the sacrificial gate layer. In some embodiments, an native oxide layer is formed in the recesses. The method 10 further includes an operation 112 where a second cleaning operation is performed to remove the native oxide layer. The method 10 further includes an operation 114 where a strained source/drain structure is formed in the recesses. The method 10 further includes an operation 116 where a dielectric structure is disposed over the substrate. In some embodiments the dielectric structure surrounds the sacrificial gate layer. In other embodiments, the dielectric structure surrounds the sacrificial gate layer and the fin structure. The method 10 further includes an operation 118 where a portion of the sacrificial gate layer is removed to form a gate trench. In some embodiments, a residue is formed in the gate trench. The method 10 further includes an operation 120 where a third cleaning operation is performed to remove the residue from the gate trench. The method 10 further includes an operation 122 where the remaining sacrificial gate layer is removed. The method 10 further includes an operation 124 where a gate dielectric layer and a metal gate electrode are disposed in the gate trench.

Figure 2A:
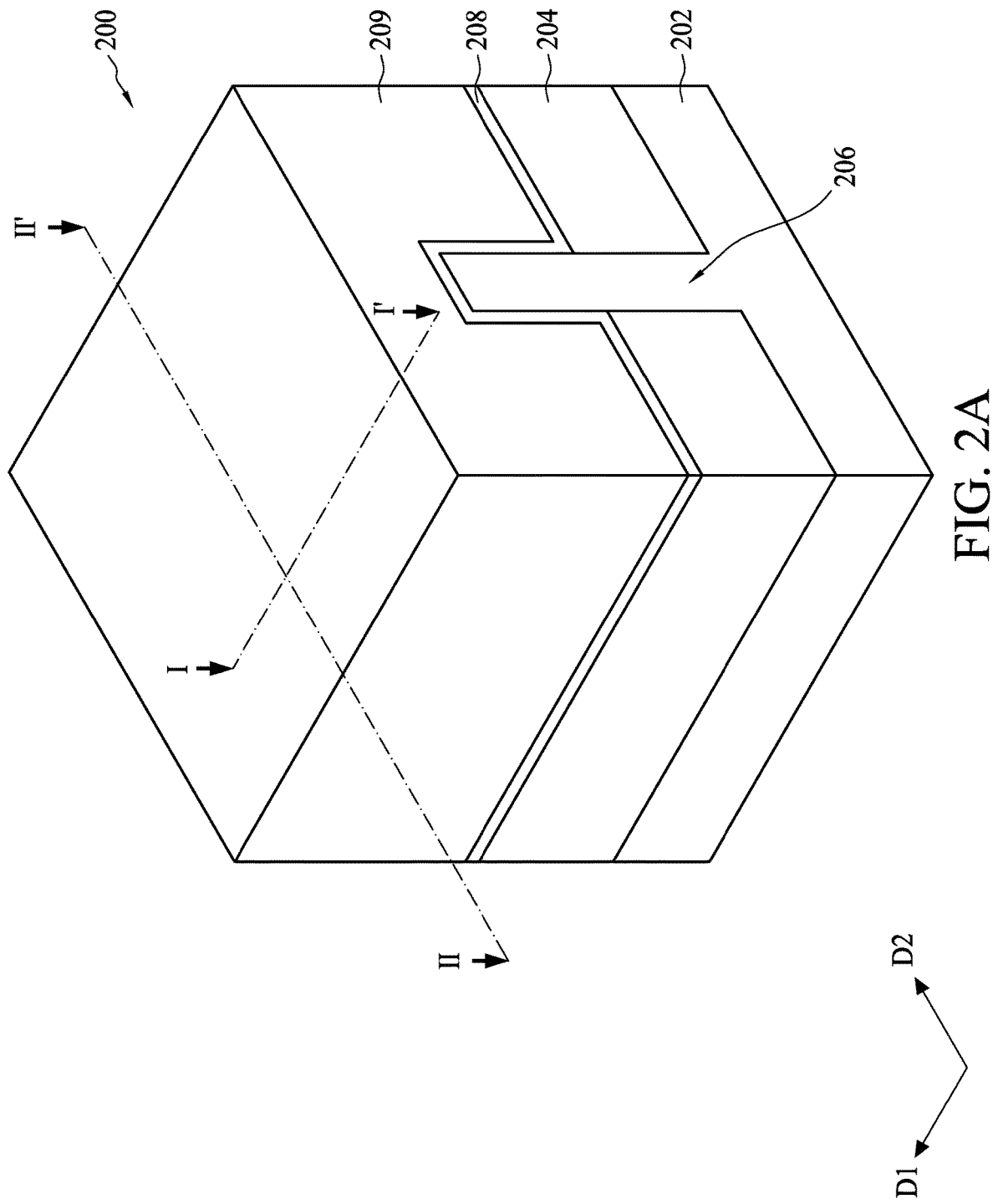
FIGS. 2A, 3A, 4A, 5A and 6A are schematic drawings illustrating a semiconductor structure at various fabrication stages constructed according to aspects of the present disclosure in one or more embodiments.
Figure 2B:
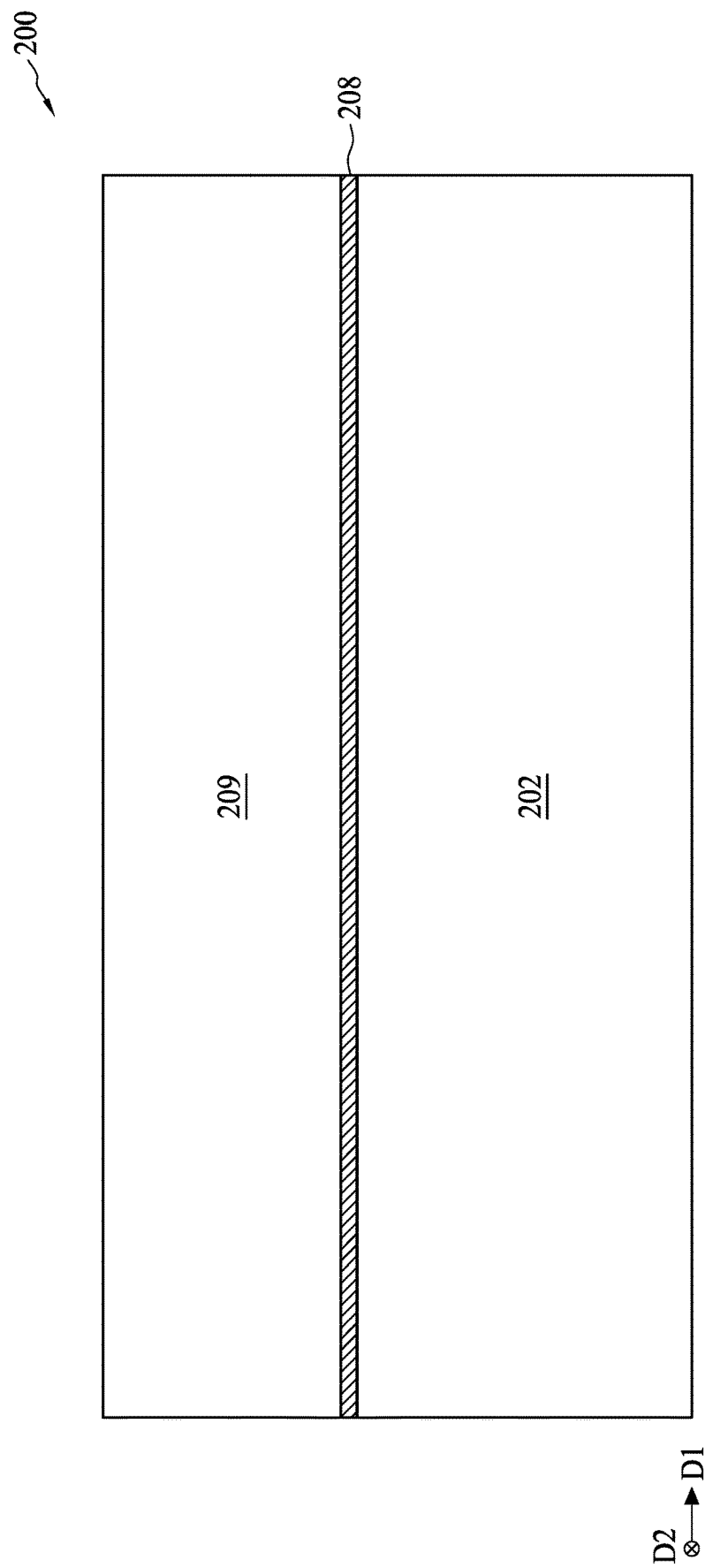
Figure 2C:
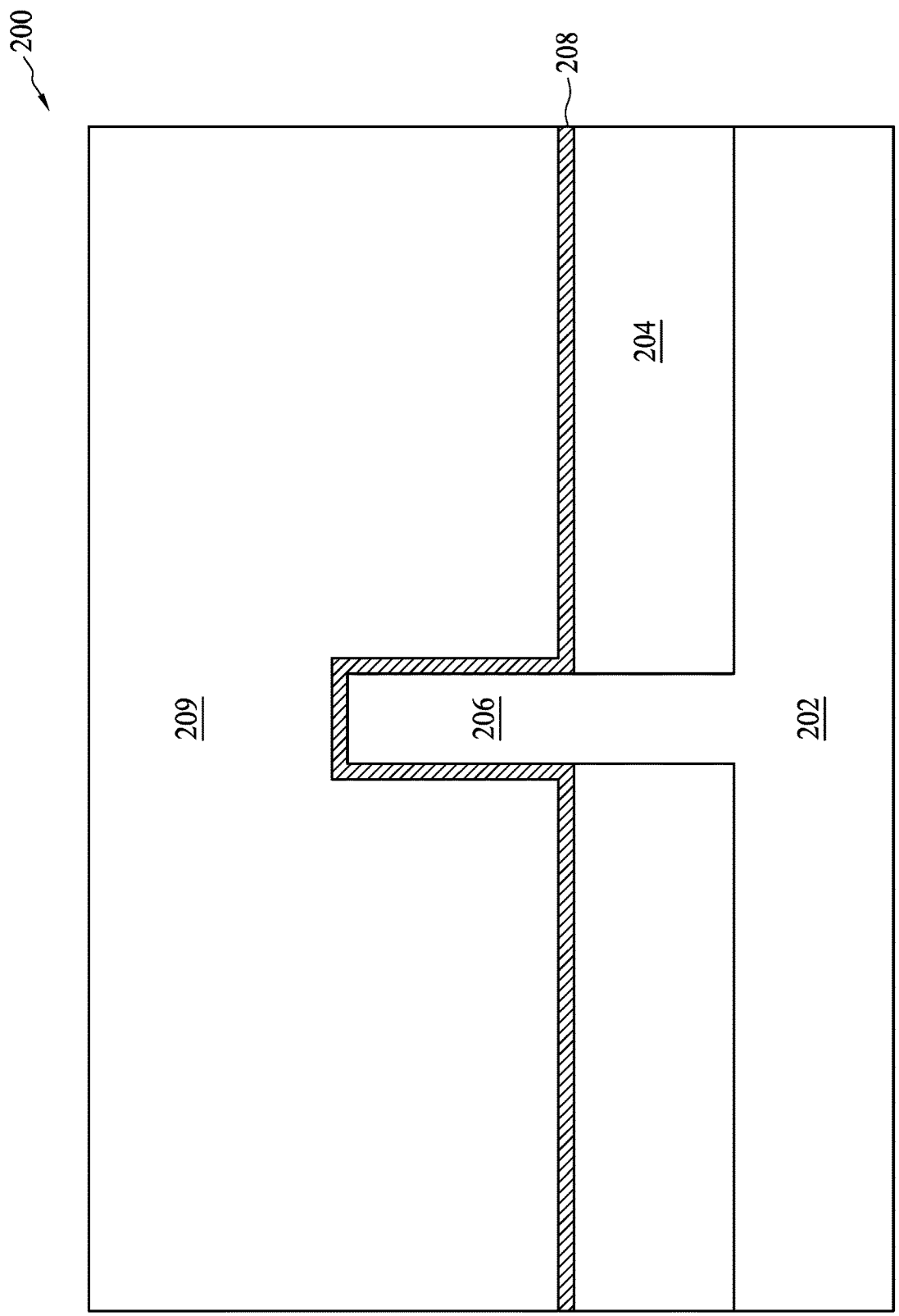
FIGS. 2C, 3C, 4C and 5C are cross-sectional views taken along a line II-II' of FIGS. 2A, 3A, 4A and 5A, respectively, according to aspects of the present disclosure in one or more embodiments.

FIGS. 2A, 3A, 4A, 5A and 6A are schematic drawings illustrating a semiconductor structure at different fabrication stages constructed according to aspects of the present disclosure in one or more embodiments. FIGS. 2B, 3B, 4B, 5B and 6B are cross-sectional views taken along a line I-I' of FIGS. 2A, 3A, 4A, 5A and 6A, respectively. FIGS. 2C, 3C, 4C and 5C are cross-sectional views taken along a line II-II' of FIGS. 2A, 3A, 4A and 5A, respectively. As shown in FIGS. 2A, 2B and 2C, a substrate 202 is received according to operation 102. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP.

The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation structures (e.g., shallow trench isolation (STI) structures) 204 interposing the regions containing different device types. In some embodiments, the substrate 202 can include fin structures 206 electrically isolated from each other by the isolation structures 204. In some embodiments, the fin structure 206 extends along a first direction D1, as shown in FIGS. 2A, 2B and 2C.

In some embodiments, a dielectric layer 208 is formed to cover the isolation structure 204, the sidewalls of the fin structure 206 and top surface of the fin structure 206, as shown in FIGS. 2A, 2B and 2C. In some embodiments, the dielectric layer 208 includes silicon oxide (SiO), but the disclosure is not limited thereto. A thickness of the dielectric layer 208 can be between approximately 20 Å and approximately 50 Å, but the disclosure is not limited thereto.

A semiconductor layer 209 is formed over the substrate 202. In some embodiments, another dielectric layer, which may serve as a sacrificial dielectric layer, can be formed prior to the forming of the semiconductor layer 209. In some embodiments, the semiconductor layer 209 is made of polysilicon, but the disclosure is not limited thereto. Consequently, the dielectric layer 208 is sandwiched between the fin structure 206 and the semiconductor layer 209, as shown in FIGS. 2A and 2C.

Figure 3A:
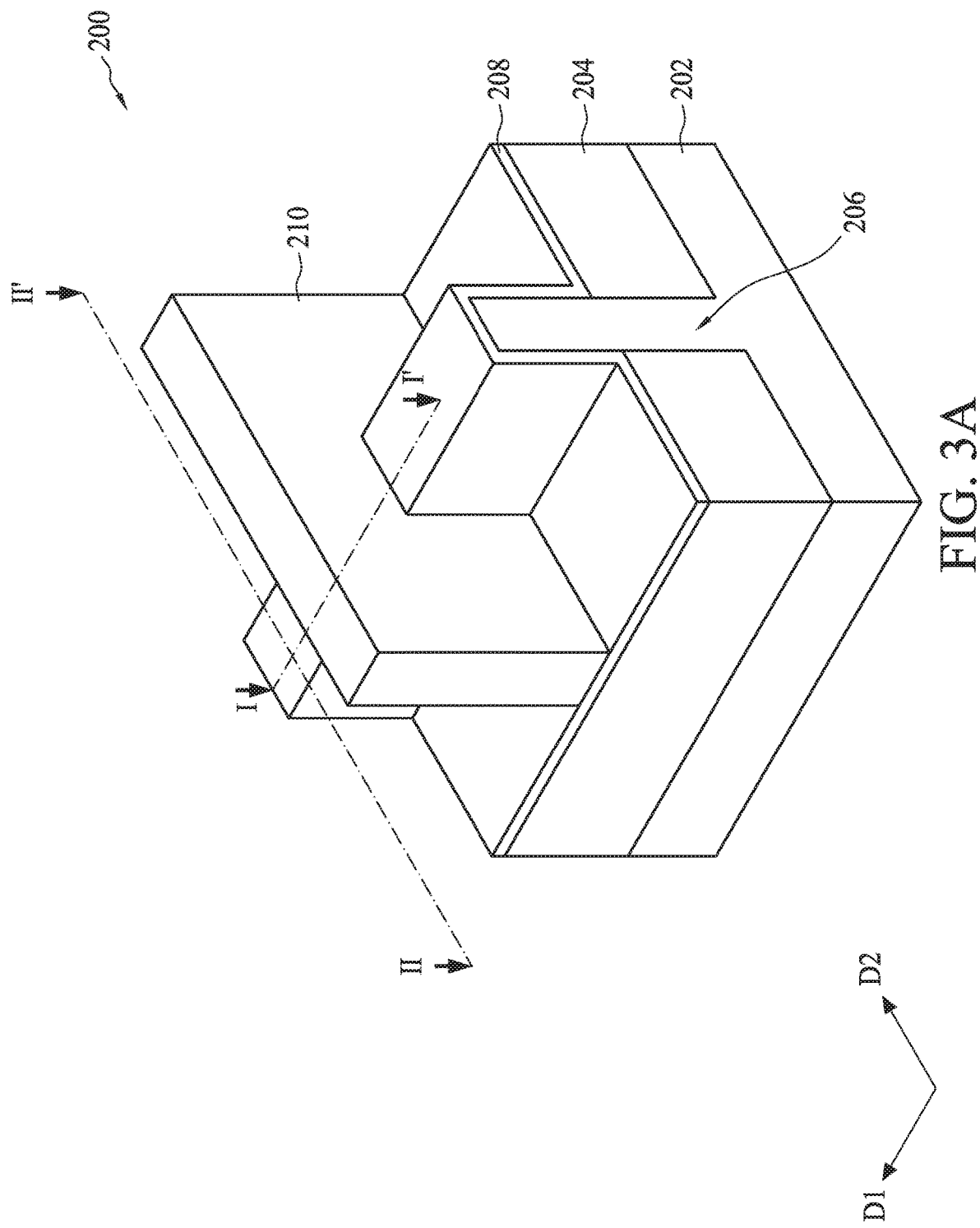
Figure 3B:
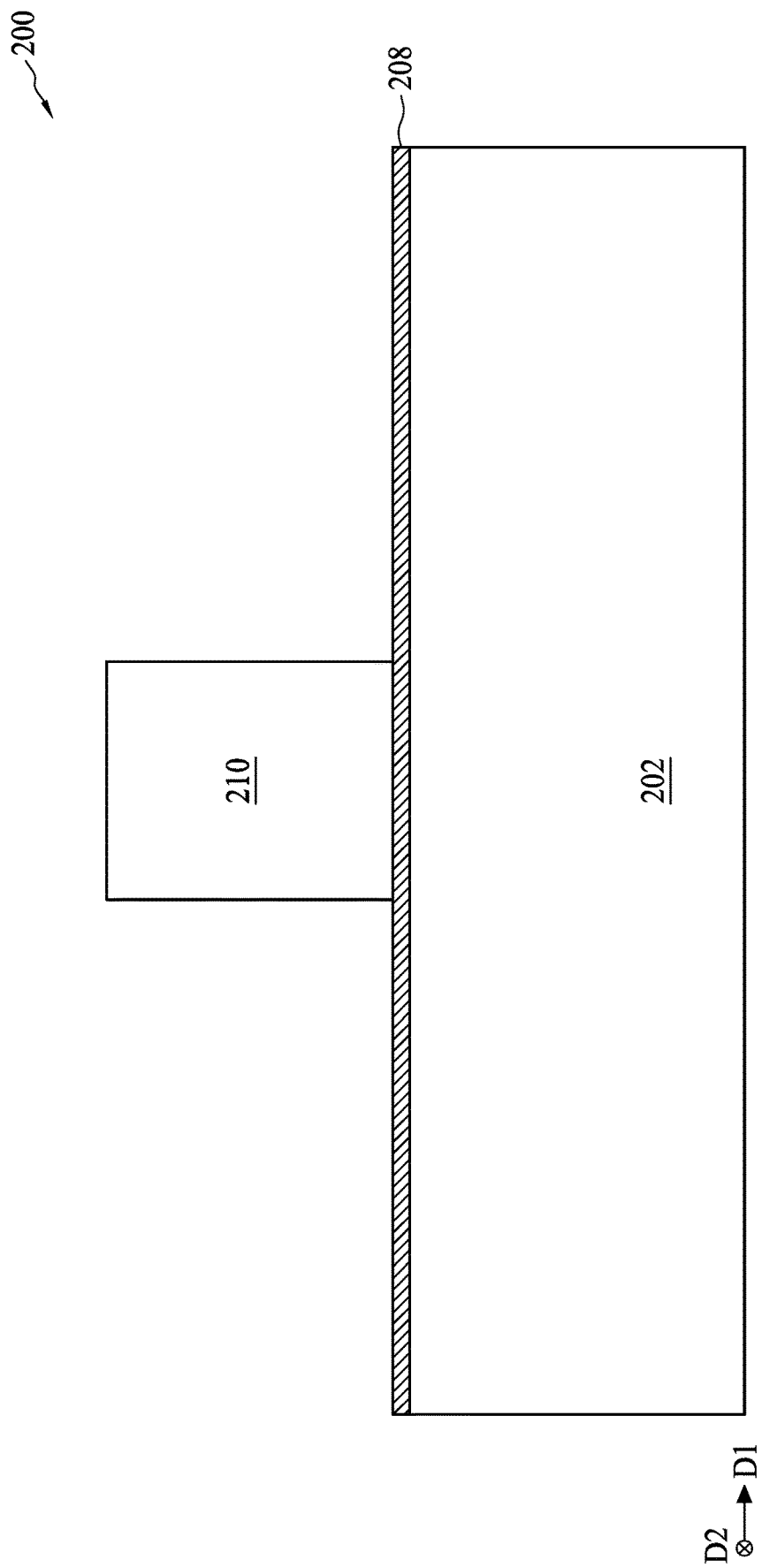
Figure 3C:
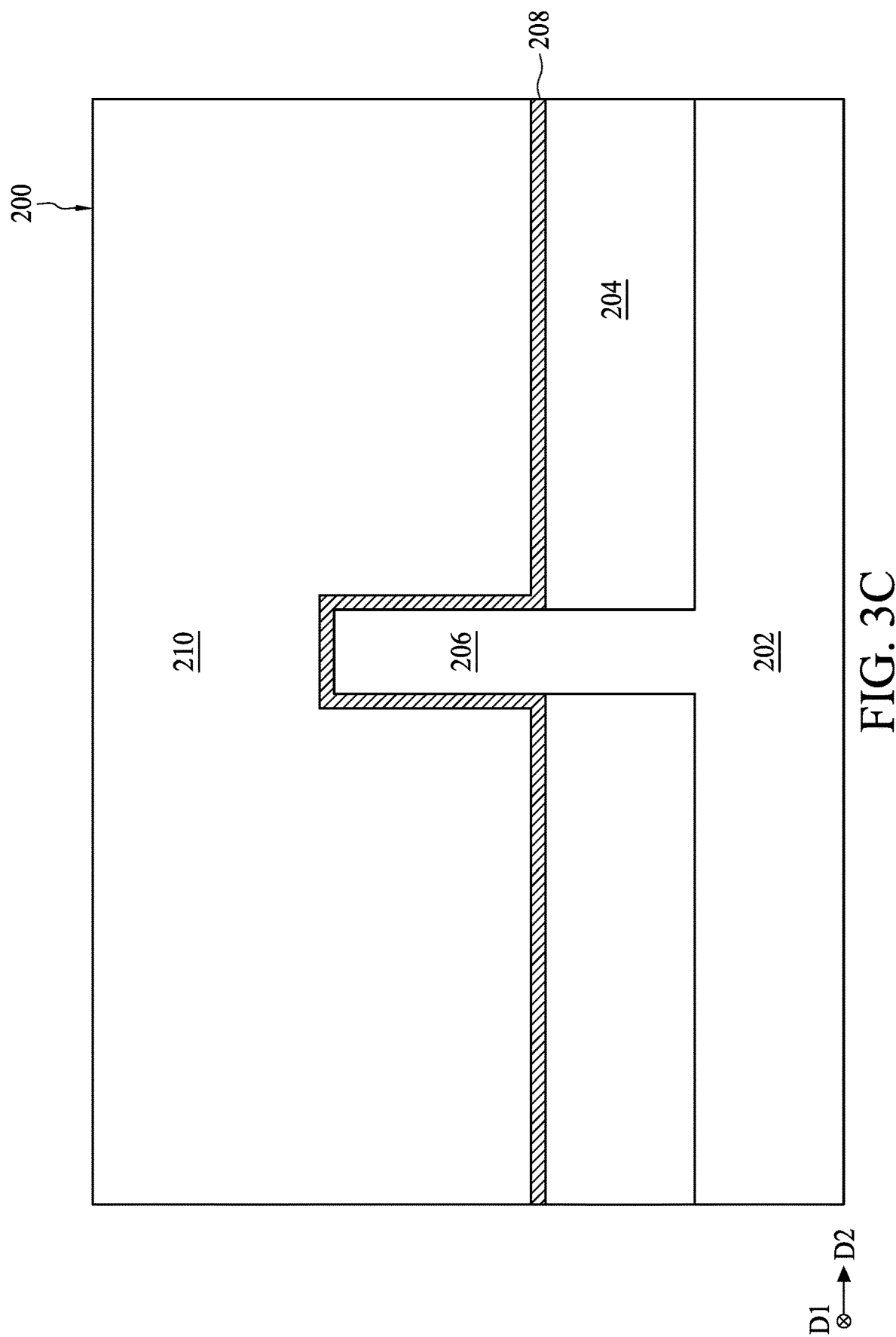

Referring to FIGS. 3A to 3C, the semiconductor layer 209 (and the sacrificial dielectric layer) is patterned to form a sacrificial gate layer 210 according to operation 104. In some embodiments, a patterned hard mask (not shown) can be formed over the semiconductor layer 209 for defining a location and a dimension of the sacrificial gate layer 210. In some embodiments, the patterned hard mask may include silicon nitride (SiN), but the disclosure is not limited thereto. The sacrificial gate layer 210 extends along a second direction D2 different from the first direction D1. Additionally, the first direction D1 and the second direction D2 are in the same horizontal plane. The sacrificial gate layer 210 covers a portion of the fin structure 206 as shown in FIGS. 3A and 3B. In other words, the sacrificial gate layer 210 is at least partially disposed over the fin structure 206, and the portion of the fin structure 206 underlying the sacrificial gate layer 210 may be referred to as the channel region. The sacrificial gate layer 210 may also define a source/drain region of the fin structure 206, for example, as portions of the fin structure 206 adjacent to and on opposing sides of the channel region. A portion of the dielectric layer 208 is exposed through the sacrificial gate layer 210 after the forming of the sacrificial gate layer 210, as shown in FIGS. 3A and 3B.

Figure 4A:
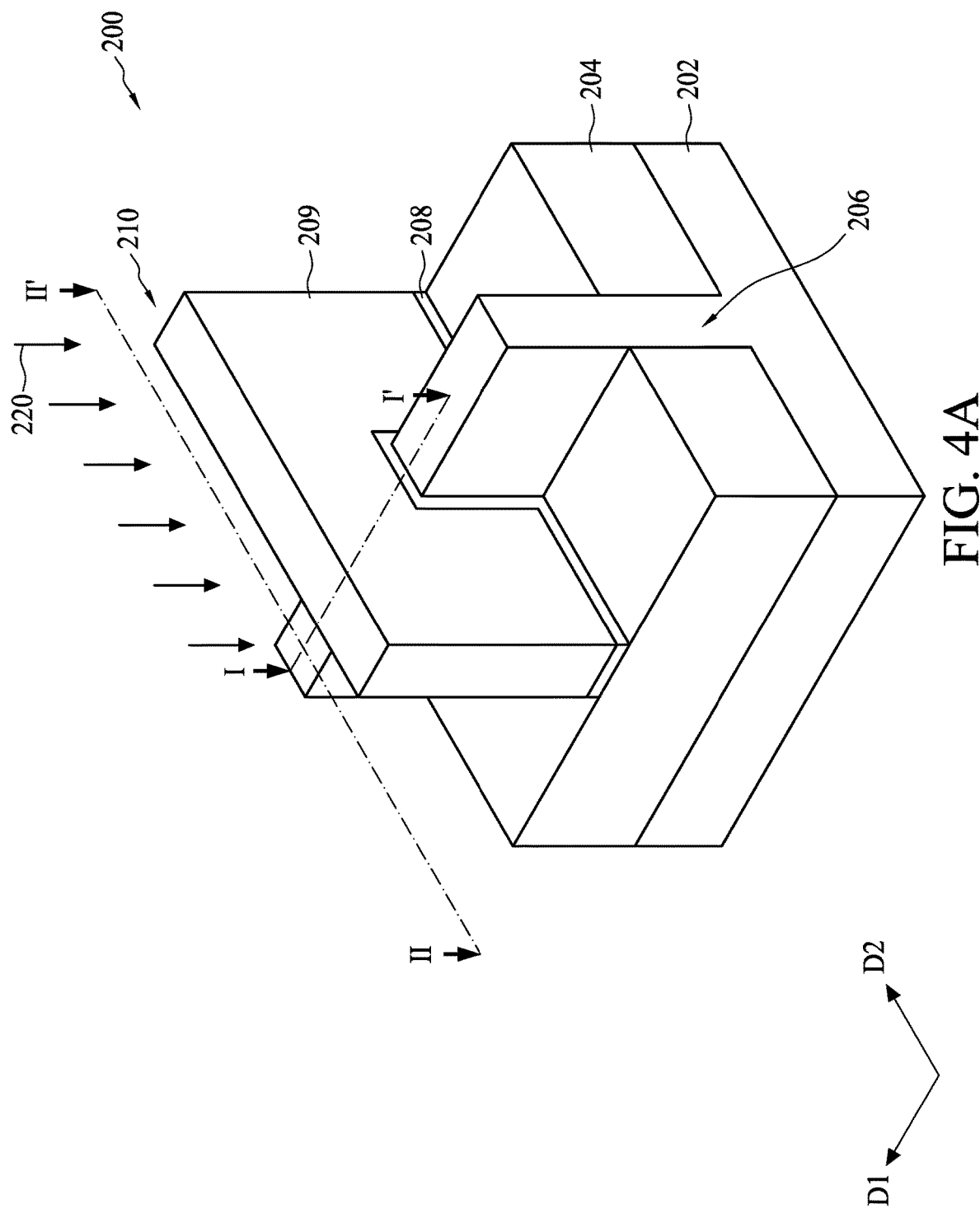
Figure 4C:
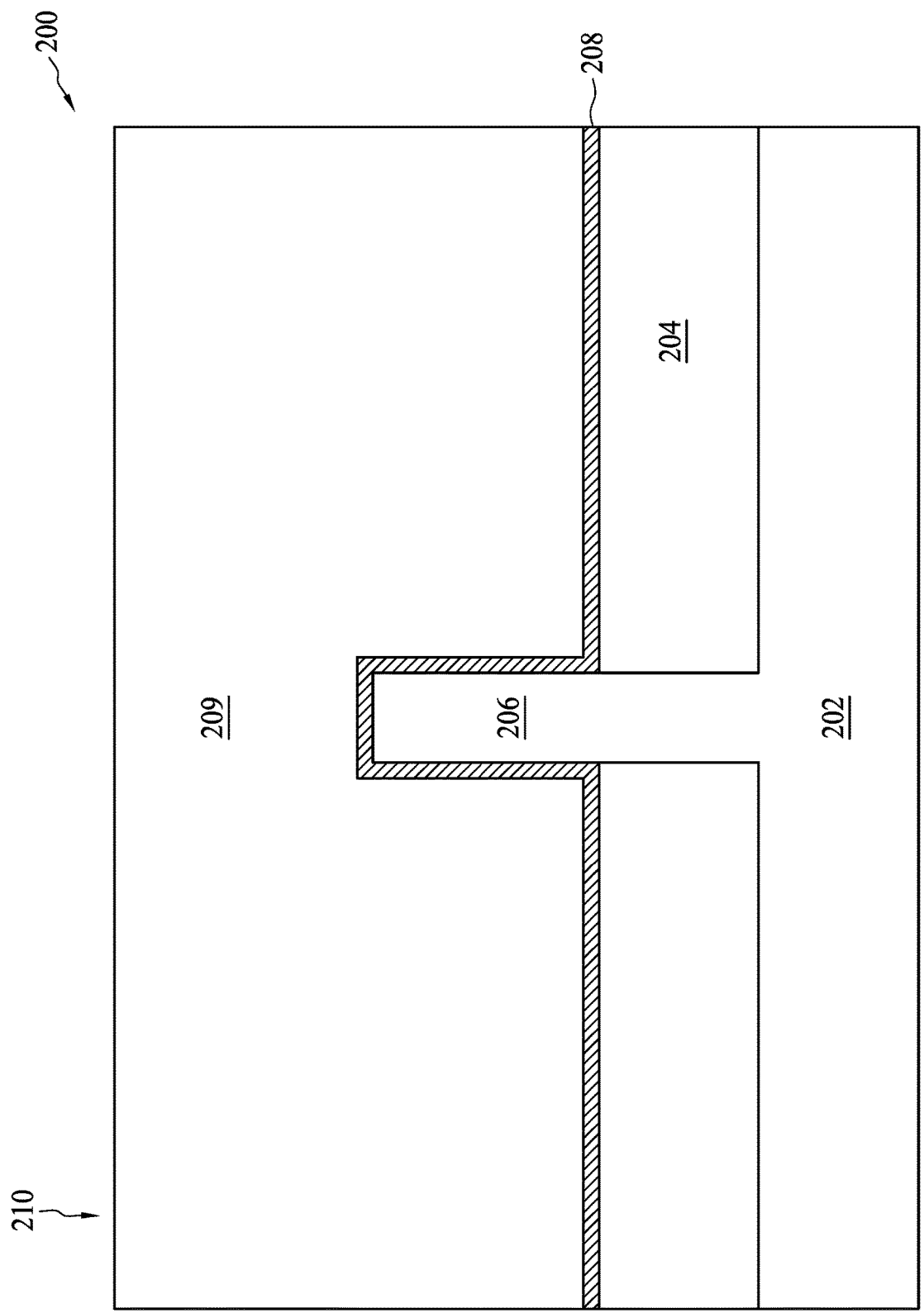

Referring to FIGS. 4A, 4B and 4C, a first cleaning operation 220 is performed according to operation 106. In some embodiments, the first cleaning operation 220 is a wet cleaning operation. In some embodiments, the first cleaning operation 220 uses a hydrogen fluoride (HF) solution. In some embodiments, a HF and $NH_3$ solution is used in the first cleaning operation 220. In those embodiments, a mass flow rate of HF is between approximately 10 standard cubic cm per minute (sccm) and approximately 30 sccm, and a mass flow rate of $NH_3$ is between approximately 30 sccm and approximately 70 sccm, but the disclosure is not limited thereto. In some embodiments, a ratio of HF to $NH_3$ is approximately 3:10, but the disclosure is not limited thereto. In some embodiments, a temperature of the HF solution in the first cleaning operation 220 is between approximately 10° C. and approximately 20° C., but the disclosure is not limited thereto. In some embodiments, a duration of the first cleaning operation 220 is between approximately 5 seconds and approximately 12 seconds, but the disclosure is not limited thereto. As shown in FIGS. 4A and 4C, the portions of the dielectric layer 208 exposed through the sacrificial gate layer 210 is removed by the performing of the first cleaning operation 220. Accordingly, the top surface and the sidewalls of the fin structure 206 and the top surface of the isolation structure 204 are exposed after the performing of the first cleaning operation 220. In some embodiments, the first cleaning operation 220 has an etching rate on Silicon Oxide higher than an etching rate on Silicon Nitride. Additionally, the first cleaning operation 220 may have an etching rate on Silicon Oxide higher than an etching rate on silicon.

Therefore, the sacrificial gate layer 210 is protected by a patterned hard mask during the performing of the first cleaning operation 220. In some embodiments, the patterned hard mask can be removed after the first cleaning operation 220, but the disclosure is not limited thereto.

Figure 5A:
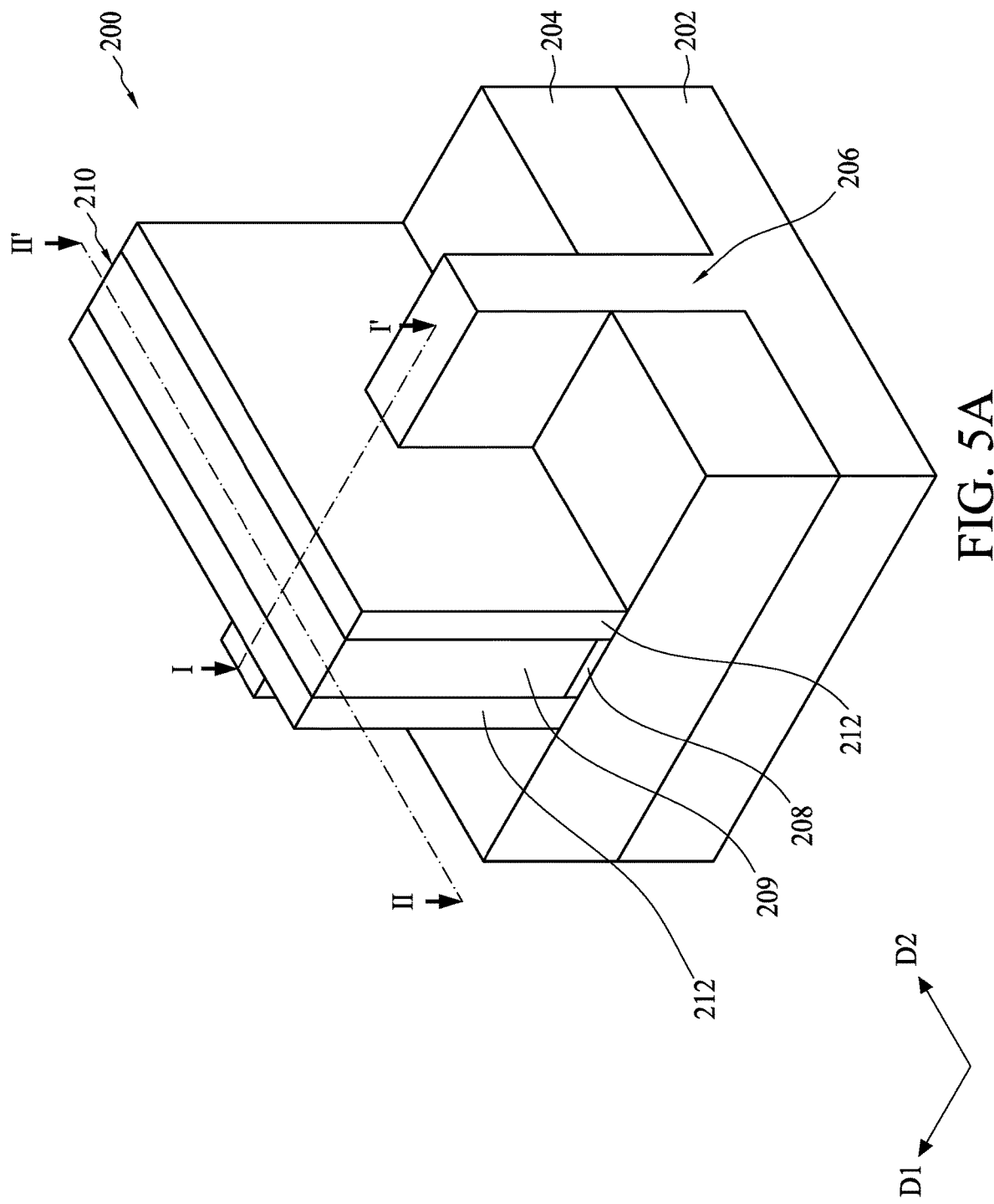
Figure 5B:
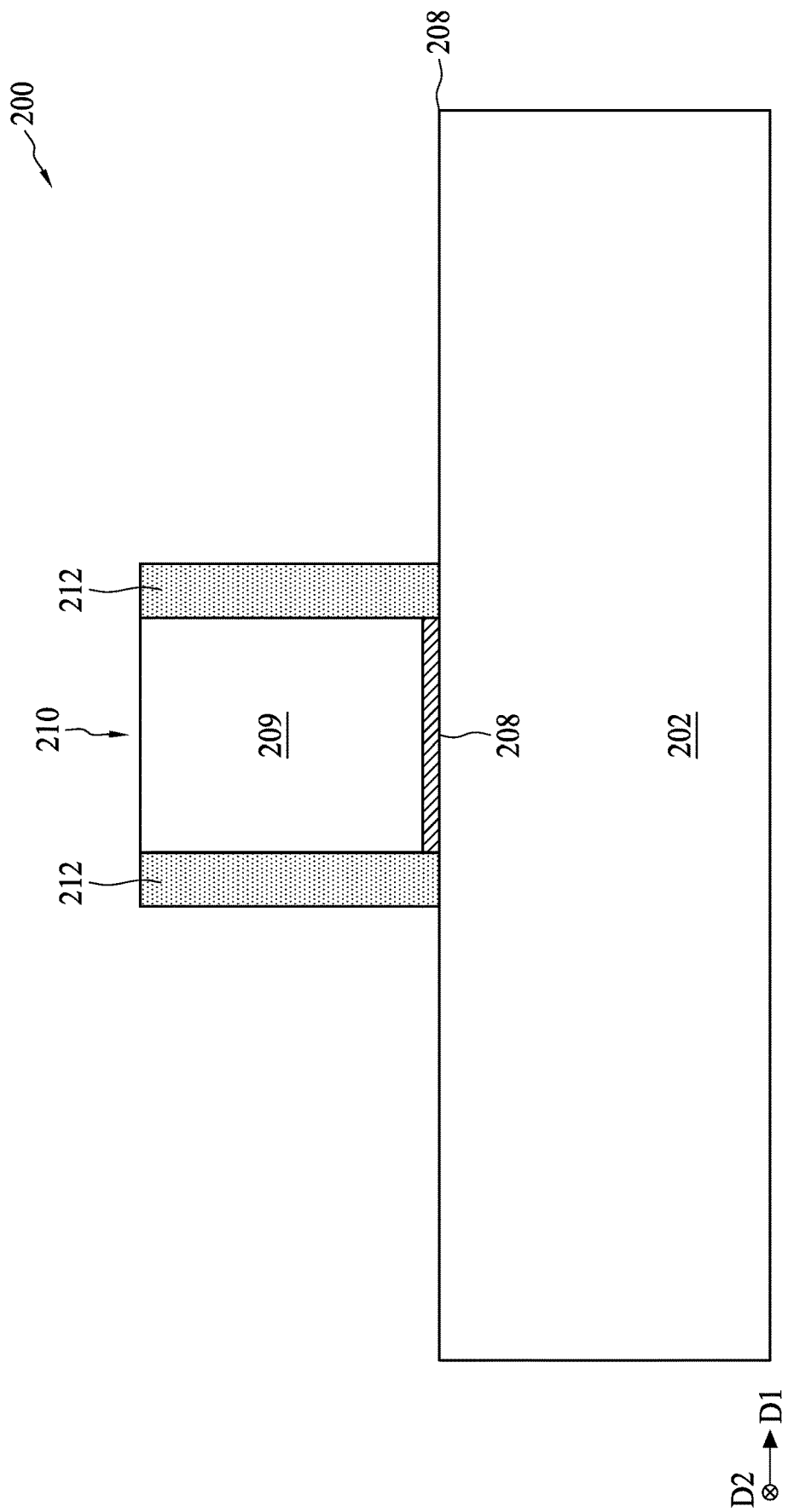
Figure 5C:
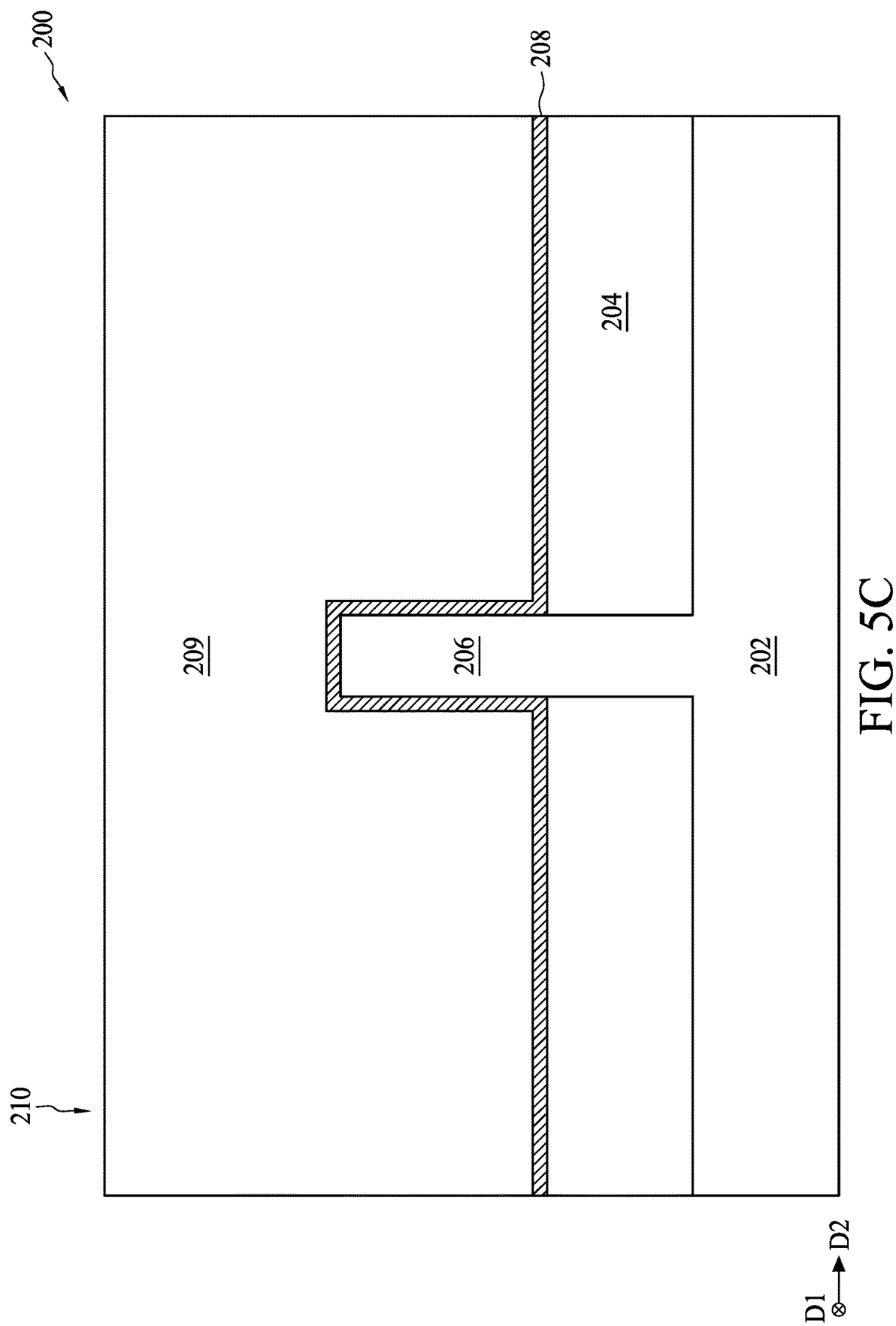

Referring to FIGS. 5A to 5C, spacers 212 are formed over sidewalls of the sacrificial gate layer 210 according to operation 108. In some embodiments, the spacers 212 are made of silicon nitride (SiN), silicon carbide (SiC), SiO, silicon oxynitride (SiON), silicon carbon or any suitable material, but the disclosure is not limited thereto. In some embodiments, the spacers 212 are formed by deposition and etching back operations.

Figure 6A:
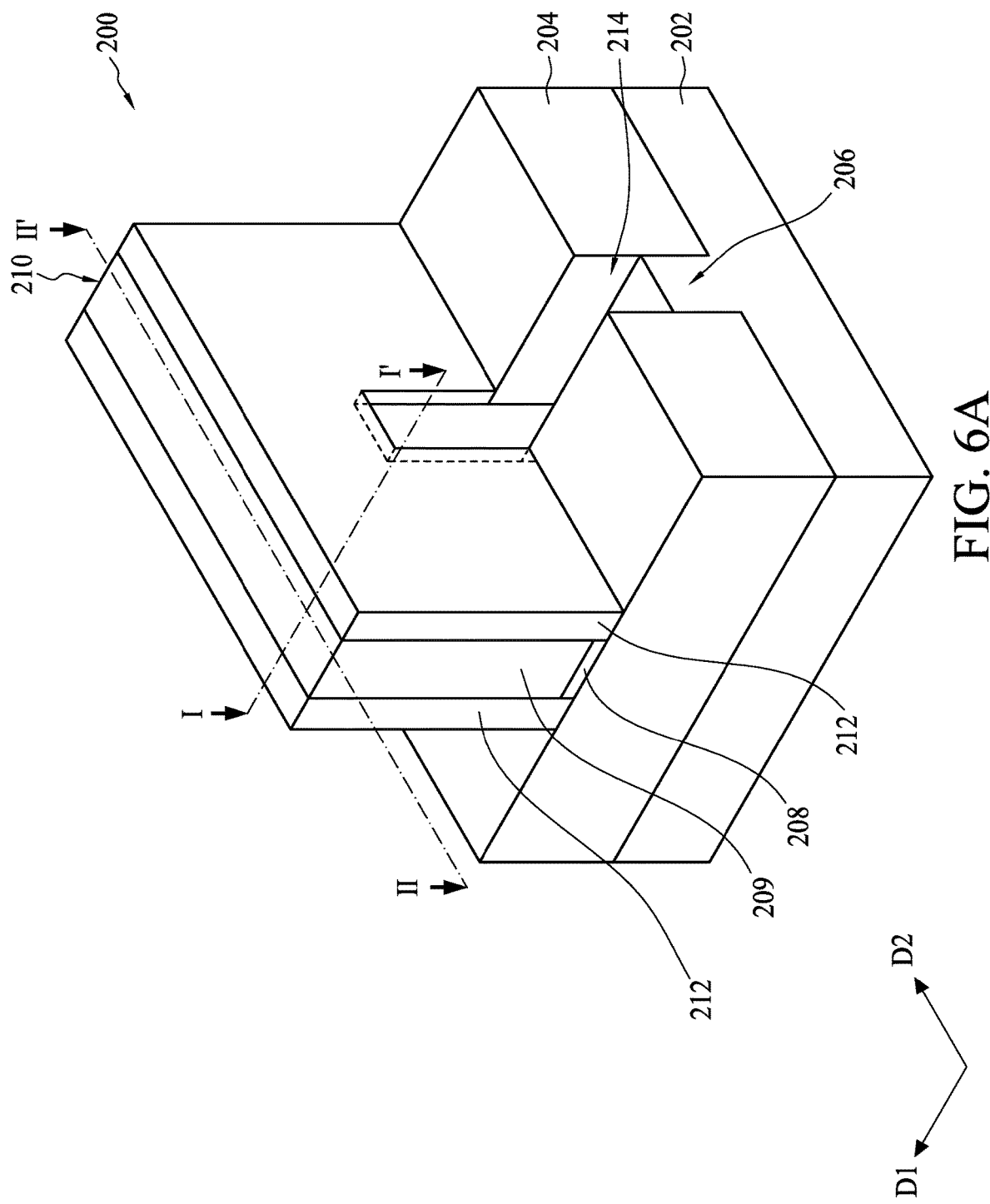
Figure 6B:
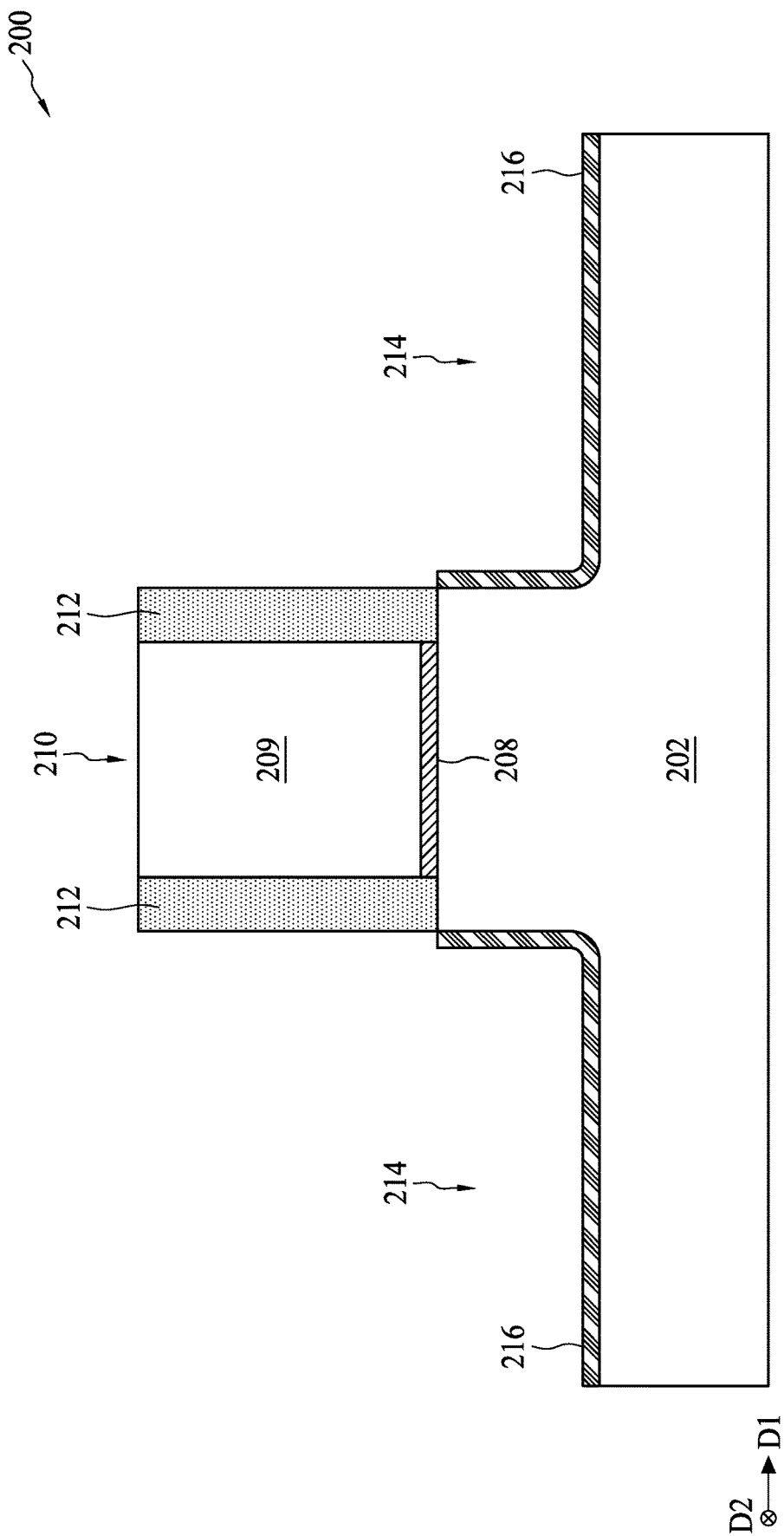

Referring to FIGS. 6A to 6B, recesses 214 are formed in the fin structure 206 at two sides of the sacrificial gate layer 210, according to operation 110. In some embodiments, a native oxide layer 216 is formed in each of the recesses 214. In some embodiments, the native oxide layer 216 is formed in the recesses 214. As shown in FIG. 6B, the native oxide layer 216 may be conformally formed to cover sidewalls and bottoms of the recesses 214. In some embodiments, when the method is intended to form a semiconductor structure for a planar device, the recesses 214 can be formed in the substrate 202.

Figure 7:
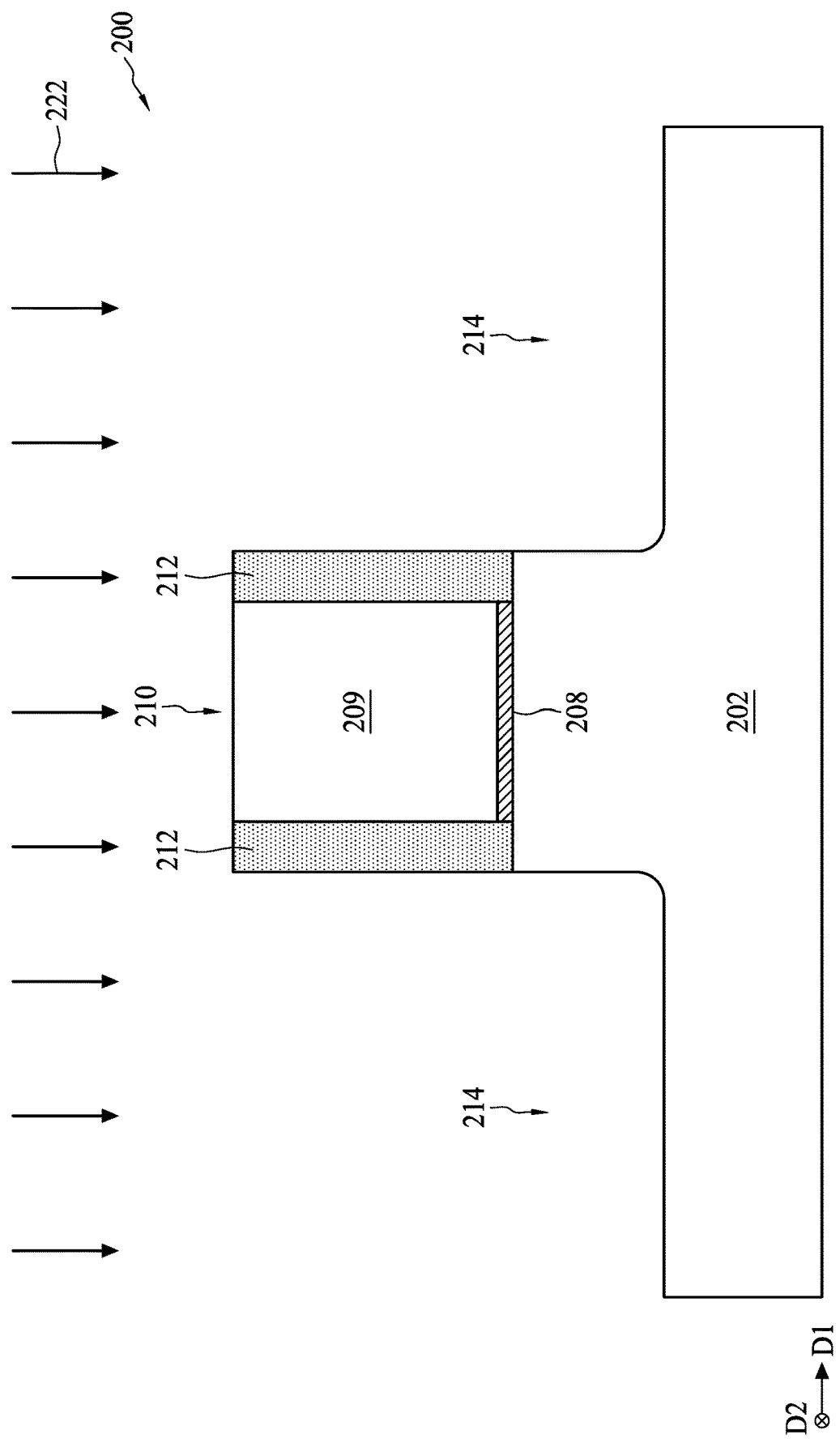
FIGS. 7 to 9 are schematic drawings illustrating a semiconductor structure at various fabrication stages subsequent to FIG. 6B according to aspects of the present disclosure in one or more embodiments.

Referring to FIG. 7, a second cleaning operation 222 is performed to remove the native oxide layer 216 according to operation 112. In some embodiments, the second cleaning operation 222 is a dry cleaning operation. In some embodiments, the second cleaning operation 222 uses an HF-containing plasma. In some embodiments, the second cleaning operation 222 uses an $NH_3$/HF-containing plasma. In some embodiments, a gas flow rate of HF in the second cleaning operation 222 is between approximately 5 sccm and approximately 15 sccm, and a gas flow rate of $NH_3$ in the second cleaning operation 222 is between approximately 40 sccm and approximately 60 sccm, but the disclosure is not limited thereto. In some embodiments, a ratio of HF to $NH_3$ is approximately 3:10, but the disclosure is not limited thereto. In some embodiments, a temperature of the second cleaning operation 222 can be higher than the temperature of the first cleaning operation 220. In some embodiments, the temperature of the substrate 202 (or the wafer) in the second cleaning operation 222 can be controlled by a heater, and the temperature of the substrate 202 in the second cleaning operation 222 can be between approximately 20° C. and approximately 50° C., but the disclosure is not limited thereto. In some embodiments, a duration of the second cleaning operation 222 is between approximately 25 seconds and approximately 50 seconds, but the disclosure is not limited thereto.

It should be noted that in some comparative embodiments, an $NF_3$-containing plasma or an $NH_3$/$NF_3$-containing plasma may be used in the second cleaning operation 222. In some embodiments, an etching rate of the HF-containing plasma on the native oxide layer 216 is between approximately 0.1 Å/sec. and approximately 1 Å/sec., but an etching rate of the $NF_3$-containing plasma on the native oxide layer 216 is between approximately 0.5 Å/sec. and approximately 1.5 Å/sec. It is found that the etching rate of the $NF_3$-containing plasma is greater than the etching rate of the HF-containing plasma, due to the greater concentration of F radicals as that provided by $NF_3$-containing plasma, which is three times the quantity of F radicals as that provided by the HF-containing plasma. However, it should be noted that when using the $NF_3$-containing plasma, the greater quantity of F radicals may attack the spacer 212 and thus an unwanted opening or an unwanted void may be formed. In other words, a damaged spacer issue is raised when using the $NF_3$-containing plasma. In some comparative embodiments, the damaged spacer issues are exacerbated when a footing of the sacrificial gate layer exists, and the opening or the void is enlarged.

Further, in some comparative embodiments, when the dielectric layer 208 remains after the forming of the sacrificial gate layer 210, the spacer 212 may be formed on the dielectric layer 208. However, the dielectric layer 208 under the spacer 212 may be removed during the second cleaning operation 222, and thus an unwanted channel is formed under the spacer 212. The unwanted channel and the unwanted void may couple to each other and thus a path under the spacer 212 and toward the sacrificial gate layer 210 may be formed.

According to the method 10, the dielectric layer 208 is removed by the performing of the first cleaning operation 220 in operation 106. Therefore, when the spacers 212 are formed on the fin structure 206 and the sidewalls of the sacrificial gate layer 210, the spacers 212 are in direct contact with the fin structure 206. Consequently, the forming of the unwanted channel under spacer 212 may be avoided. Further, the native oxide layer 216 is removed by the HF-containing plasma used in the second cleaning operation 222 in operation 112. Since the etching rate of the HF-containing plasma used in the second cleaning operation 222 is less than that of the $NF_3$-containing plasma, damage to the spacer 212 is reduced. Consequently, the unwanted opening and the damaged spacer issue are both mitigated.

In some embodiments, since the spacers 212 are in direct contact with the fin structure 206, and the spacers 212 remain intact after the performing of the second cleaning operation 222, the path (i.e., the channel under the spacer and opening) where the metal extrusion to be formed may be avoided.

Figure 8:
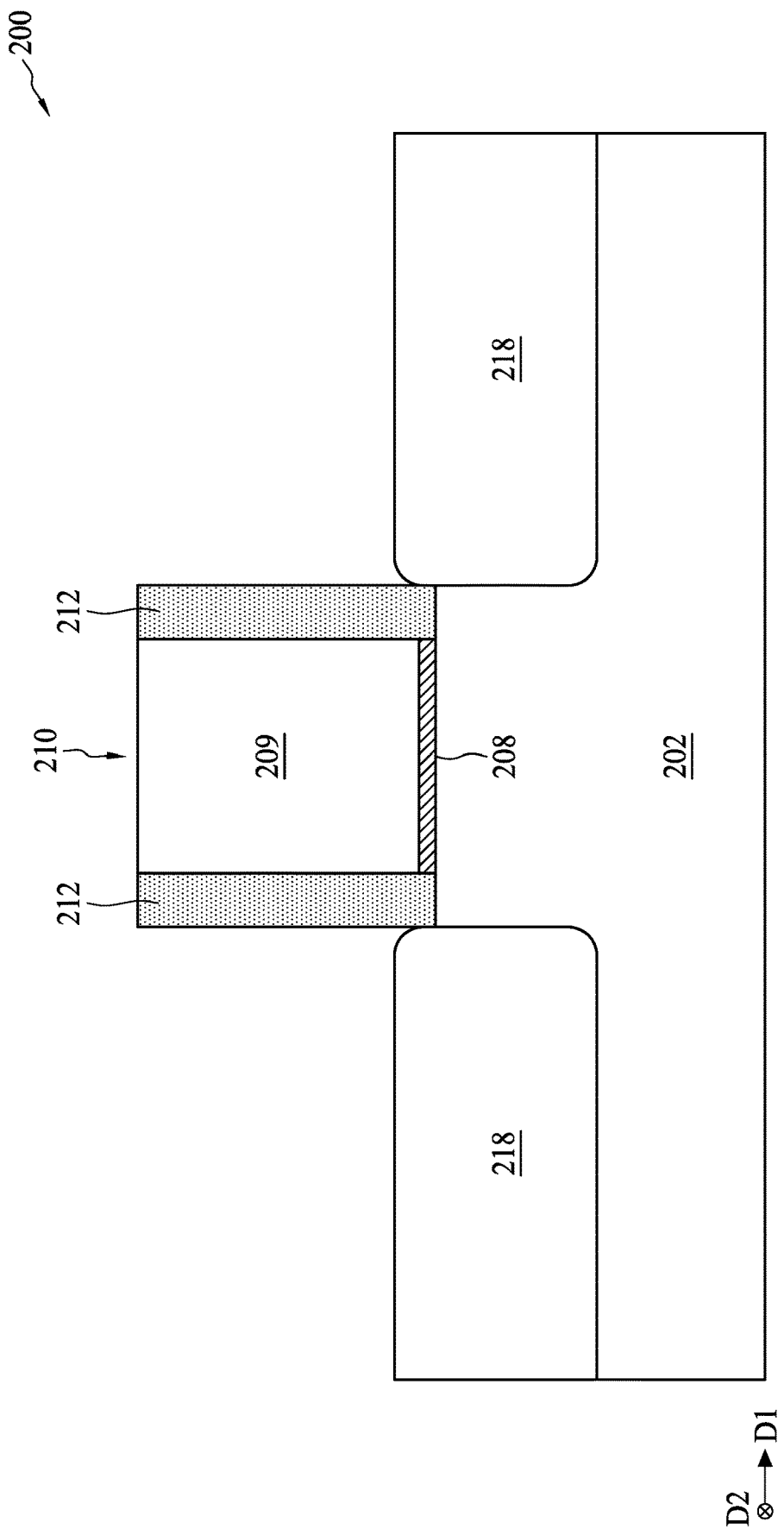

Referring to FIG. 8, a strained source/drain (S/D) structure 218 is formed in each of the recesses 214, according to operation 114. In some embodiments, the strained S/D structures 218 are formed by growing a strained material in the recesses 214 by an epitaxial (epi) operation. In some embodiments, a lattice constant of the strained material may be different from a lattice constant of the substrate 202 and the fin structure 206. In some embodiments, the strained S/D structures 218 may include Ge, SiGe, InAs, InGaAs, InSb, GaSb, InAlP, InP, or a combination thereof, but the disclosure is not limited thereto.

Figure 9:
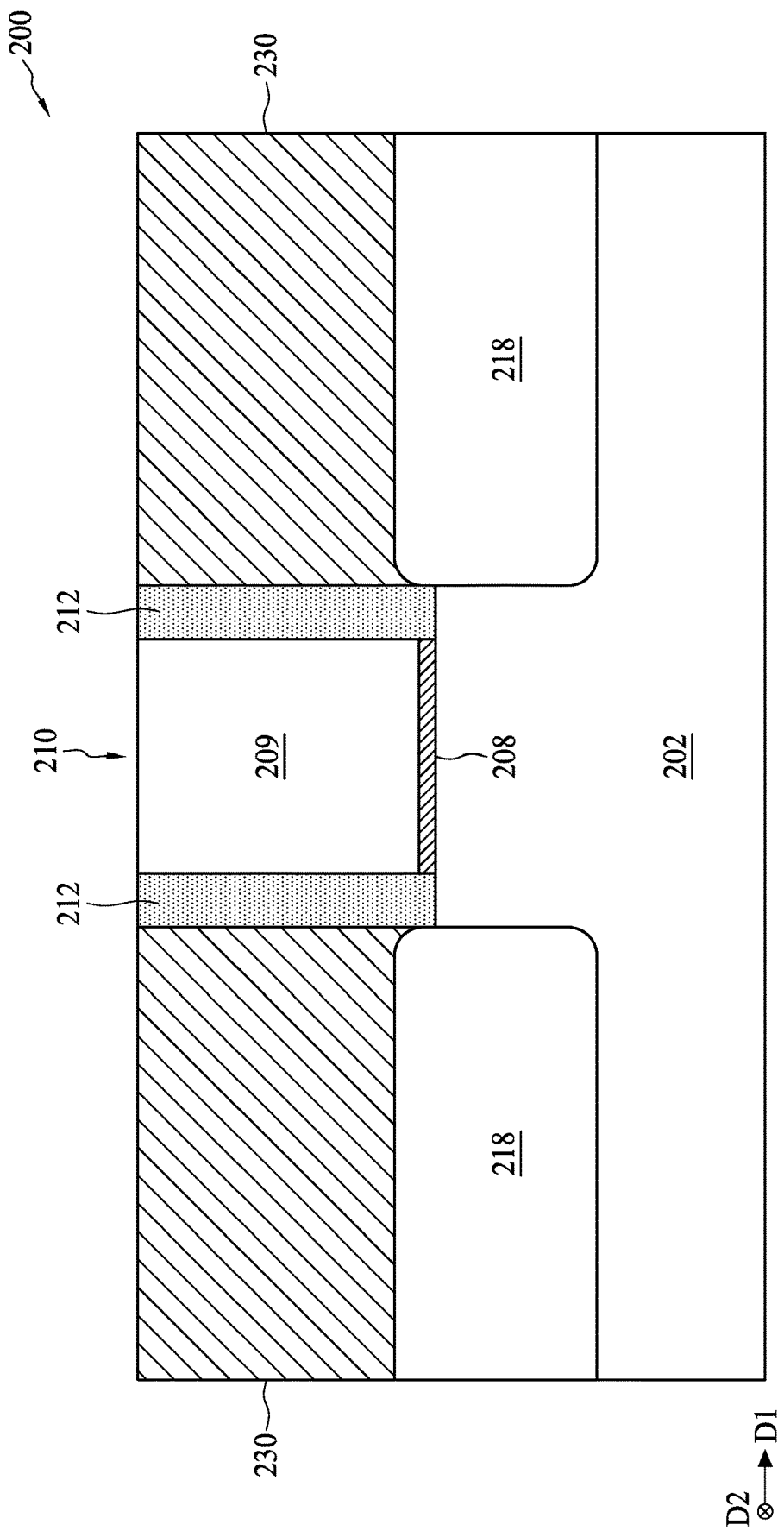

Referring to FIG. 9, a dielectric structure 230 is formed over the substrate 202 according to operation 116. In some embodiments, the dielectric structure 230 can include an etch-stop layer (e.g., a contact etch stop layer (CESL)) (not shown) and various dielectric layers (e.g., an inter-layer dielectric (ILD) layer) formed over the substrate 202 after the forming of the strained S/D structures 218. In some embodiments, the CESL includes a SiN layer, a SiCN layer, a SiON layer, and/or other materials known in the art. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL and the ILD layer are deposited, a planarization process, such as a chemical mechanical planarization (CMP) operation, may be performed to form the dielectric structure 230. Consequently, the dielectric structure 230 surrounds the sacrificial gate layer 210 and the fin structure 206. In other words, the fin structure 206 and the sacrificial gate layer 210 are embedded in the dielectric structure 230, while a top surface of the sacrificial gate layer 210 remains exposed, as shown in FIG. 9.

In some embodiments, the sacrificial gate layer 210 can be replaced with the metal gate structure by operations described in operations 118 to 124, but the disclosure is not limited thereto.

Figure 10A:
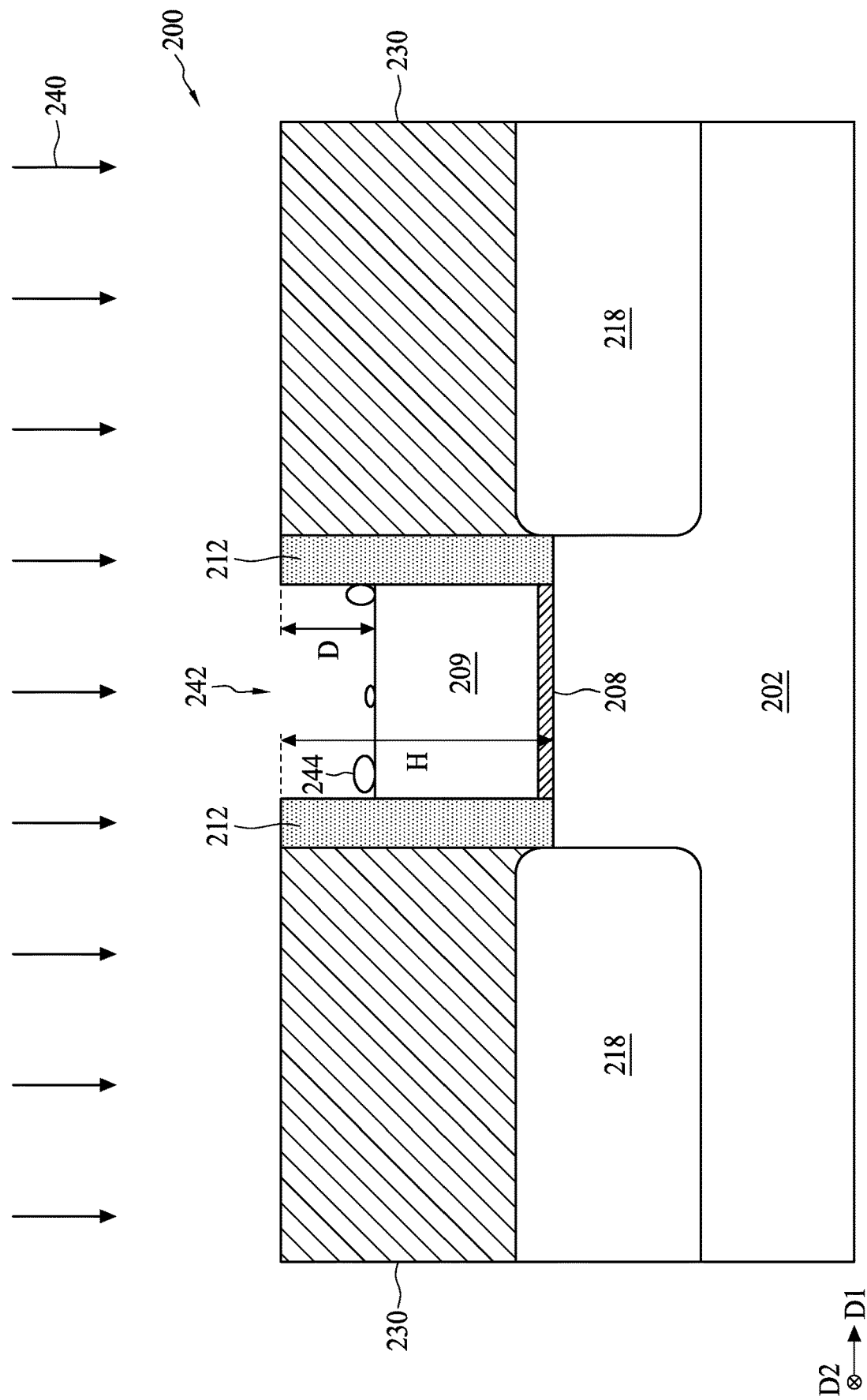
FIGS. 10A, 11A and 12A are cross-sectional views illustrating a semiconductor structure at various fabrication stage constructed according to aspects of the present disclosure in one or more embodiments.
Figure 10B:
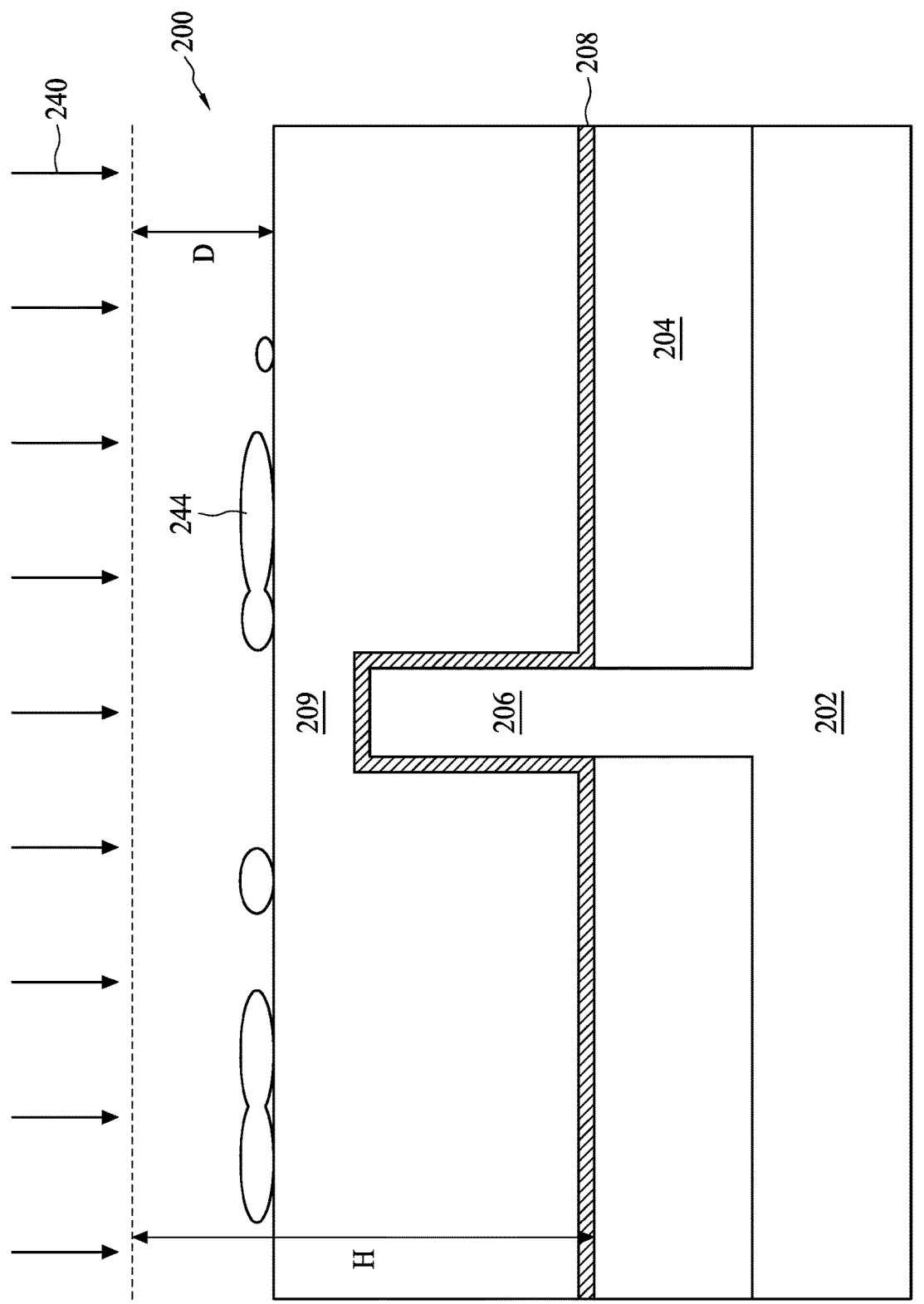
FIGS. 10B, 11B and 12B are different cross-section views of the semiconductor structure of FIGS. 10A, 11A and 12A, respectively, according to aspects of the present disclosure in one or more embodiments.

Referring to FIGS. 10A and 10B, a portion of the sacrificial gate layer 210 is removed to form a gate trench 242 in the dielectric structure 230, according to operation 118. In some embodiments, a dry etching operation 240 is performed to remove the portion of the sacrificial gate layer 210. In some embodiments, the dry etching operation 240 uses F-containing plasma, Cl-containing plasma and/or B-containing plasma to remove the portion of the sacrificial gate layer 210. For example but not limited thereto, the F-containing plasma may include F-containing gas such as $CF_4$, $SF_6$, $CH_2F_2$, $CHF_3$, and/or $C_2F_6$. For example but not limited thereto, the Cl-containing plasma may include Cl-containing gas such as $Cl_2$, $CHCl_3$, $CCl_4$ and/or $BCl_3$. For example but not limited thereto, the Br-containing plasma may include Br-containing gas such as HBr and/or $CHBr_3$. In some embodiments, a ratio of a depth D of the gate trench 242 to a height H of the sacrificial gate layer 210 is between approximately 1:2 and approximately 1:5, but the disclosure is not limited thereto. Further, a residue 244 is formed during the removal of the portion of the sacrificial gate layer 210, and the residue 244 may include fluoride residue, chloride residue or bromide residue.

Figure 11A:
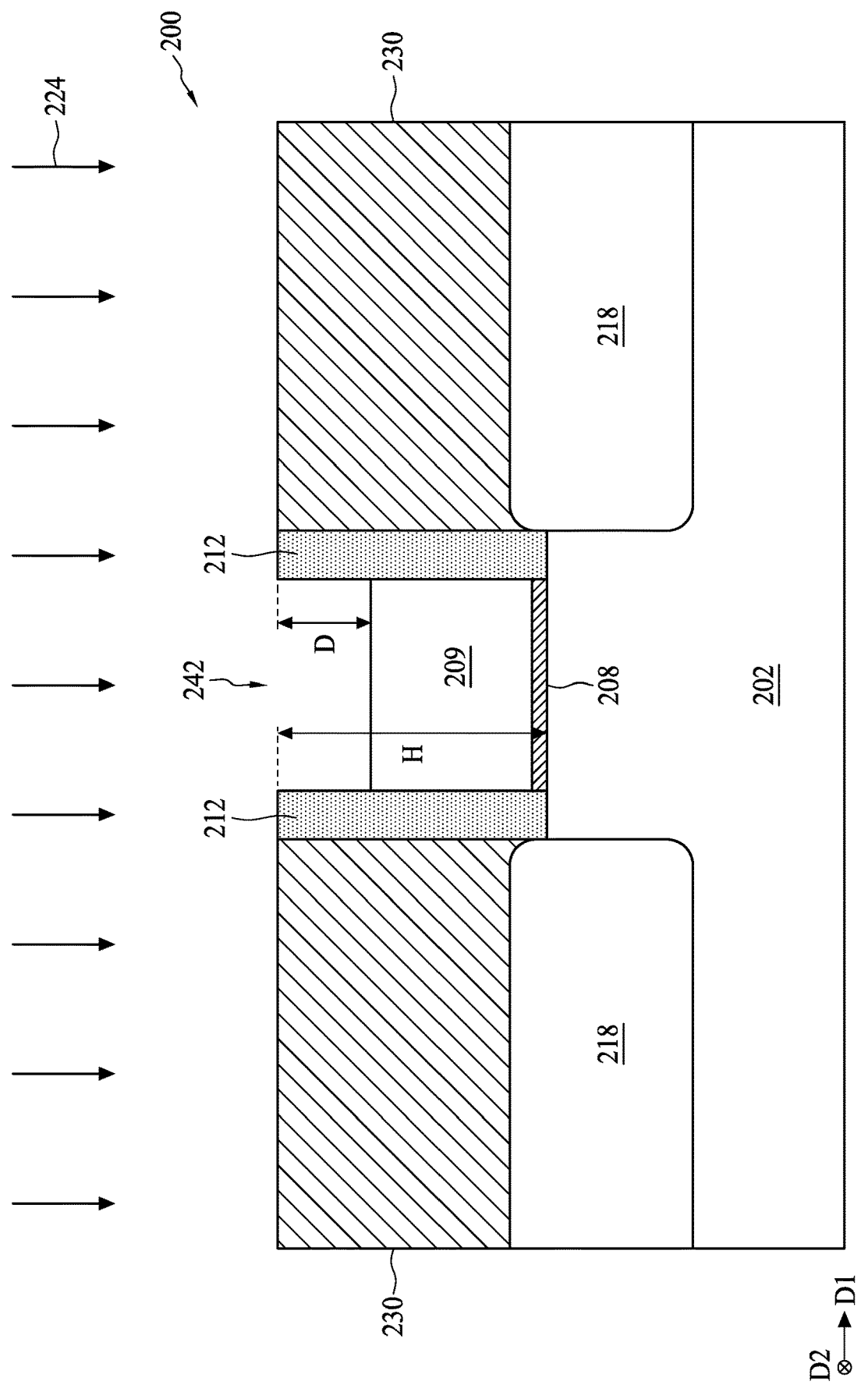
Figure 11B:
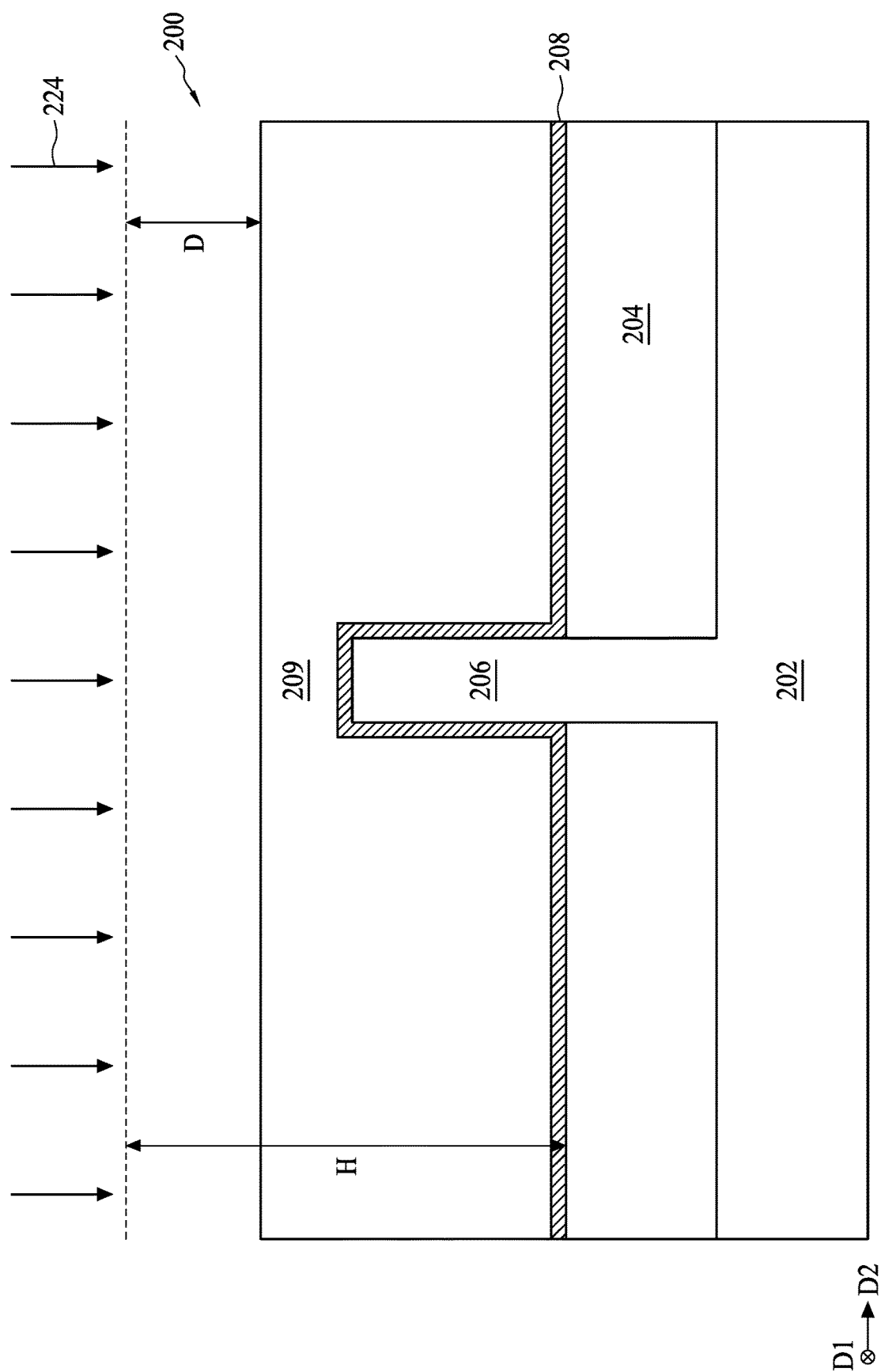

Referring to FIGS. 11A and 11B, a third cleaning operation 224 is performed to remove residue 244 according to operation 120. In some embodiments, the third cleaning operation 224 is a plasma cleaning operation. In some embodiments, the plasma cleaning operation includes a hydrogen-containing plasma cleaning operation. In some embodiments, a gas flow rate of the H-containing plasma is approximately 100 sccm, but the disclosure is not limited thereto. In some embodiments, an output power of the plasma cleaning operation is approximately 300 watts, but the disclosure is not limited thereto. In some embodiments, a gas pressure of the third cleaning operation 224 is approximately 100 mT, but the disclosure is not limited thereto. In some embodiments, a duration of the third cleaning operation 224 is between approximately 8 seconds and approximately 15 seconds, but the disclosure is not limited thereto. According to operation 120, the H radical in the H-containing plasma can attract the fluoride residue, the chloride residue or the bromide residue. Therefore the residue 244 can be removed by the third cleaning operation 224.

Figure 12A:
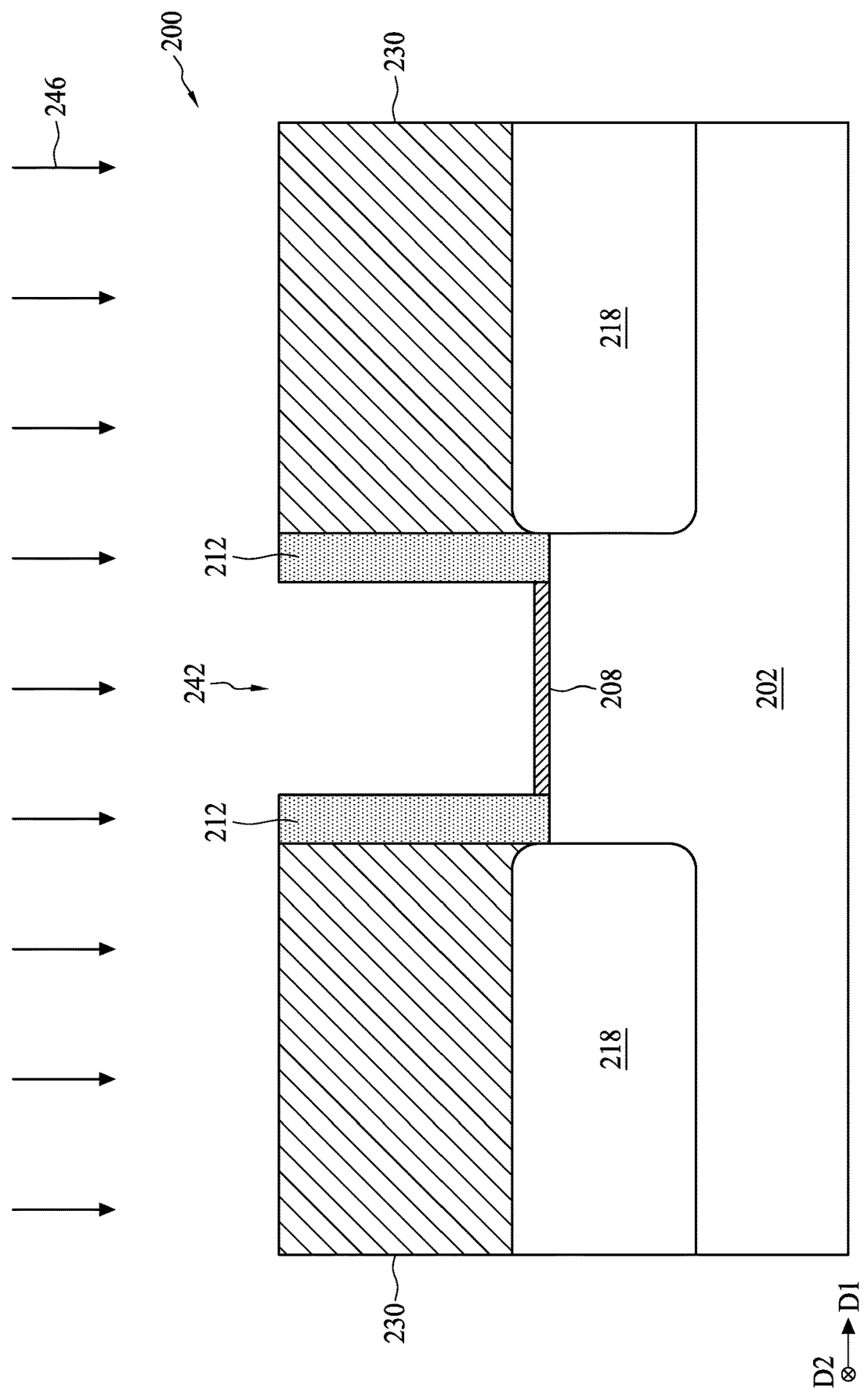
Figure 12B:
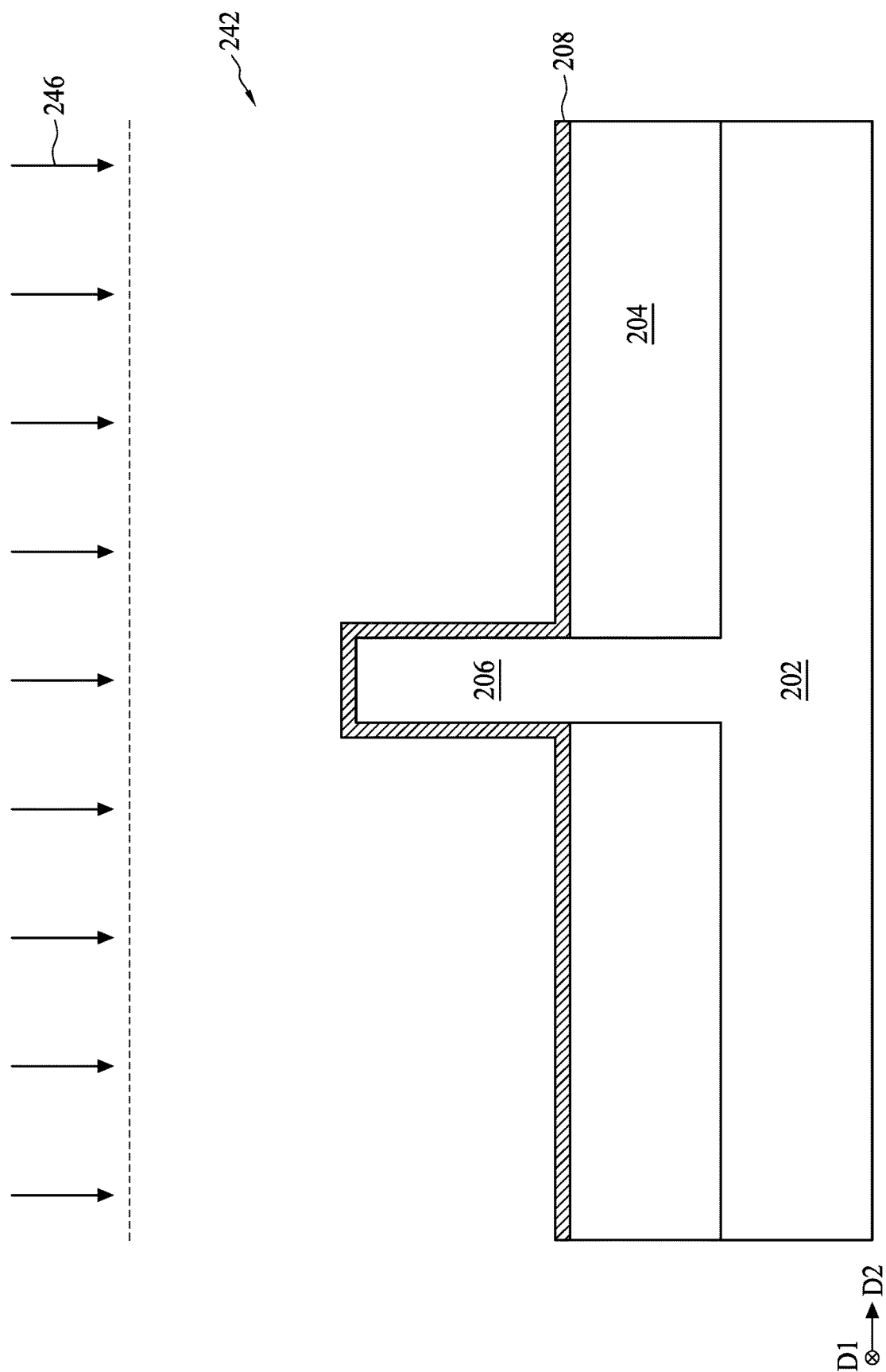

Referring to FIGS. 12A and 12B, the remaining sacrificial gate layer 210 is removed, and thus the gate trench 242 is deepened, according to operation 122. Further, the dielectric layer 208 is exposed to the gate trench 242, and the fin structure 206 protrudes from the bottom of the gate trench 242 as shown in FIG. 12B. In some embodiments, the removal of the remaining sacrificial gate layer 210 includes a wet etching 246. In some embodiments, the wet etching 246 uses an ammonium hydroxide ($NH_4OH$) solution. According to the method, the residue 244 that may serve as an etchant on the dielectric layer 208 during the wet etching 246 has been removed by the third cleaning operation 224, and therefore the dielectric layer 208 may remain substantially intact and still exposed to the gate trench 242 after the wet etching 246.

Figure 13:
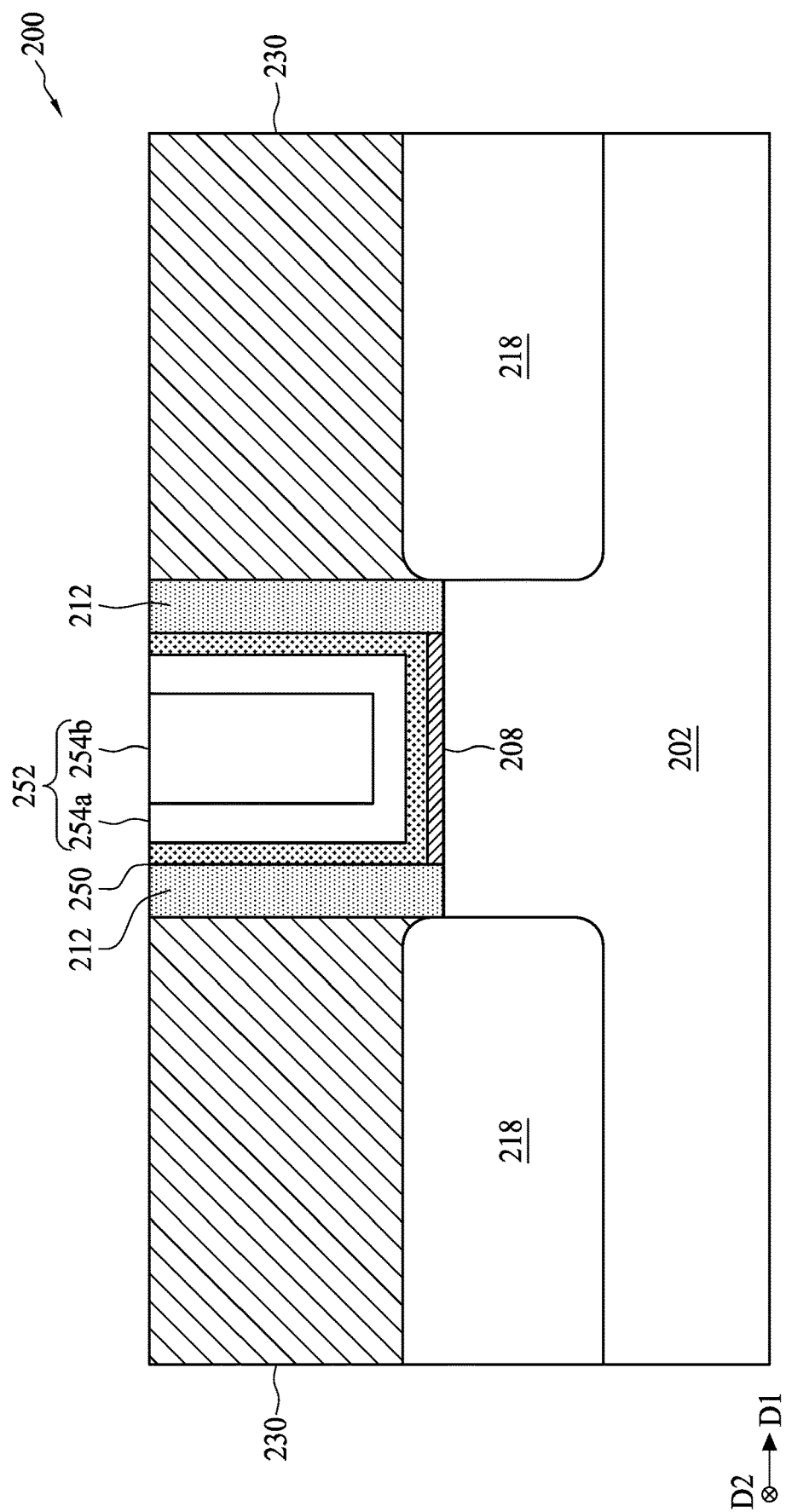
FIG. 13 is a cross-sectional view illustrating a semiconductor structure according to aspects of the present disclosure in one or more embodiments.

It should be understood that the substrate 202 may include various device regions, and the various device regions may include various n-type and p-type FET devices and one or more devices such as a resistor. It should be also understood that different devices may require different elements. In some embodiments, when an I/O FET device is required, the dielectric layer 208 can serve as an interfacial layer (IL). Subsequently, a gate dielectric layer 250 and a metal gate electrode 252 are formed in the gate trench 242 according to operation 124. As shown in FIG. 13, the gate dielectric layer 250 and the metal gate electrode 252 are formed over the dielectric layer 208. Because the dielectric layer 208 is prevented from being consumed by the third cleaning operation 224, the electrical performance of the I/O FET device can be improved.

It should be noted that in some comparative embodiments, when the third cleaning operation 224 is omitted and the wet etching 246 is performed directly after the dry etching 240, the residue 244 may serve as an etchant on the dielectric layer 208. In such comparative embodiments, the dielectric layer 208 may be damaged, and an unwanted opening may be formed. The unwanted opening may be filled with the metal gate electrode and thus a metal gate extrusion is formed.

Figure 14:
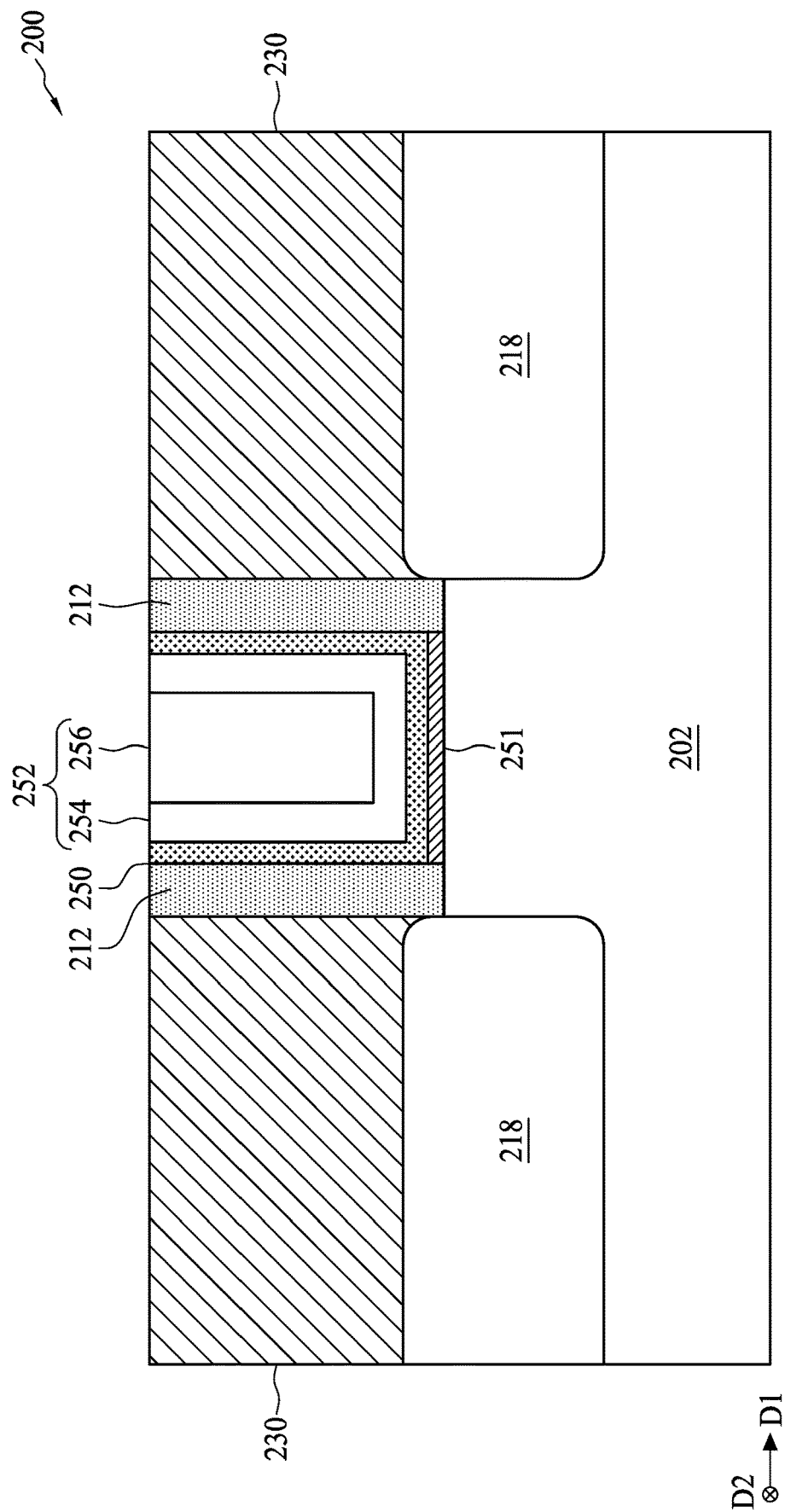
FIG. 14 is a cross-sectional view illustrating a semiconductor structure according to aspects of the present disclosure in one or more embodiments.

Referring to FIG. 14, in some embodiments, when a core FET device is required, the dielectric layer 208 is removed to expose the fin structure 206 to the gate trench 242. It should be noted that the dielectric layer 208 should be kept intact before the removal of the dielectric layer 208, such that the controllability of the removal operation can be improved. Subsequently, a gate dielectric layer 250 and a metal gate electrode 252 are formed in the gate trench 242 according to operation 124. In some embodiments, an interfacial layer (IL) 251 is formed in the gate trench 242 prior to the forming of the gate dielectric layer 250. The IL 251 may include an oxide-containing material such as SiO or SiON. In some embodiments, the IL 251 covers the portions of fin structure 206 in the gate trench 242.

Still referring to FIG. 14, after the forming of the IL 251, the gate dielectric layer 250 is formed on the IL 251. In some embodiments, the gate dielectric layer 250 includes a high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof. The metal gate electrode 252 is then formed on the gate dielectric layer 250. In some embodiments, the metal gate electrode 252 can include at least a barrier metal layer (not shown), a work functional metal layer 254a and a gap-filling metal layer 254b. The barrier metal layer can include, for example but not limited to, TiN. The work function metal layer 254a can include a single layer of TiN, TaN, TaAlC, TiC, TaC, Co, Al, TiAl, HfTi, TiSi, TaSi or TiAlC, or a multilayer of two or more of these materials, but is not limited to this. For the n-channel FET, one or more of TaN, TaAlC, TiN, TiC, Co, TiAl, HfTi, TiSi and TaSi is used as the work function metal layer 254a, and for the p-channel FET, one or more of TiAlC, Al, TiAl, TaN, TaAlC, TiN, TiC and Co is used as the work function metal layer 254a. In some embodiments, the gap-filling metal layer 254b can include conductive material such as Al, Cu, AlCu, or W, but is not limited to the above-mentioned materials.

In other comparative embodiments, the dielectric layer 208 may be damaged or removed, and the fin structure 206 may be etched during the wet etching 246. Consequently, the metal gate electrode 252 may be directly in contact with the fin structure, resulting in failure of the operations for forming the FinFET device.

The present disclosure provides a method for forming the semiconductor structure. The method may include three cleaning operations. The first cleaning operation is performed to remove the dielectric layer with an HF solution after the forming of the sacrificial gate layer. Accordingly, the subsequently formed spacer can be directly in contact with the fin structure. The second cleaning operation is performed to remove the native oxide layer with the HF-containing plasma after the forming of the recesses, which accommodate the strained S/D structures. Accordingly, the damaged spacer issue can be mitigated because the HF-containing plasma has a lower etching rate. The third cleaning operation is performed to remove the residue generated during the dry etching used to remove the portion of the sacrificial gate layer. Accordingly, the residue, which may serve as an etchant in the subsequent wet etching, can be removed and the consumption of the dielectric layer can be prevented, and thus the dielectric layer remains substantially intact. In some embodiments, the intact dielectric layer can serve as an IL in the subsequent metal gate formation. In some embodiments, the intact dielectric layer improves controllability of a subsequent removal operation. As mentioned above, the metal gate extrusion issue can be mitigated by the performing of the first, the second and the third cleaning operations.

In some embodiments, a method for forming a semiconductor structure is provided. The method includes the following operations. A substrate is received. The substrate includes a fin structure, a semiconductor layer formed over the fin structure, and a dielectric layer sandwiched between the fin structure and the semiconductor layer. The semiconductor layer is patterned to form a sacrificial gate layer over a portion of the fin structure. A first cleaning operation is performed with a HF solution. Spacers are formed over sidewalls of the sacrificial gate layer. Recesses are formed in the fin structure at two sides of the sacrificial gate layer. A second cleaning operation is performed with an HF-containing plasma.

In some embodiments, a method for forming a semiconductor structure is provided. The method includes the following operations. A substrate is received. The substrate includes a sacrificial gate layer and a dielectric structure surrounding the sacrificial gate layer. A portion of the sacrificial gate layer is removed to form a gate trench in the dielectric structure. A plasma cleaning operation is performed. The remaining sacrificial gate layer is removed to deepen the gate trench. A gate dielectric layer and a metal gate electrode are formed in the gate trench.

In some embodiments, a method for forming a semiconductor structure is provided. The method includes the following operations. A substrate is received. The substrate includes a fin structure, a semiconductor layer formed over the fin structure, and a dielectric layer sandwiched between the fin structure and the semiconductor layer. The semiconductor layer is patterned to form a sacrificial gate layer over a portion of the fin structure. The portion of the dielectric layer is exposed. A first cleaning operation is performed to remove the exposed dielectric layer. Spacers are formed over sidewalls of the sacrificial gate layer. Recesses are formed in the fin structure at two sides of the sacrificial gate layer, and a native oxide layer is formed in the recesses. A second cleaning operation is performed to remove the native oxide layer. A strained source/drain structure is formed in the recesses. A dielectric structure surrounding the sacrificial gate layer and the fin structure is formed over the substrate. A portion of the sacrificial gate layer is removed to form a gate trench, and a residue is formed in the gate trench. A third cleaning operation is performed to remove the plurality of residues from the gate trench. The remaining sacrificial gate layer is removed to deepen the gate trench. A gate dielectric layer and a metal gate electrode are formed in the gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   receiving a substrate having a fin structure, a semiconductor layer over the fin structure, and a dielectric layer sandwiched between the fin structure and the semiconductor layer;
   patterning the semiconductor layer to form a sacrificial gate layer over a portion of the fin structure;
   performing a first cleaning operation with a hydrogen fluoride (HF) solution;
   forming spacers over sidewalls of the sacrificial gate layer;
   forming recesses in the fin structure at two sides of the sacrificial gate layer; and
   performing a second cleaning operation with an HF-containing plasma, wherein the HF-containing plasma comprises HF and $NH_3$.

2. The method of claim 1, wherein a portion of the dielectric layer is exposed after the forming of the sacrificial gate layer, and the portion of the dielectric layer exposed through the sacrificial gate layer is removed by the performing of the first cleaning operation.

3. The method of claim 1, wherein the fin structure extends along a first direction, and the sacrificial gate layer extends along a second direction different from the first direction.

4. The method of claim 1, further comprising forming a strained source/drain structure in each of the recesses after the performing of the second cleaning operation.

5. The method of claim 1, further comprising:
   forming a dielectric structure over the substrate, wherein the fin structure and the sacrificial gate layer are embedded in the dielectric structure;
   removing the sacrificial gate layer to form a gate trench in the dielectric structure; and
   disposing a gate dielectric layer and a metal gate electrode in gate trench.

6. The method of claim 1, wherein the HF solution comprises HF and ammonia ($NH_3$).

7. A method for forming a semiconductor structure, comprising:
   receiving a substrate having a sacrificial semiconductor gate layer and a dielectric structure surrounding the sacrificial semiconductor gate layer;

removing a portion of the sacrificial semiconductor gate layer to form a gate trench in the dielectric structure by a first plasma;

performing a plasma cleaning operation, wherein the plasma cleaning operation comprises using a second plasma different from the first plasma;

removing the remaining sacrificial semiconductor gate layer to deepen the gate trench; and disposing a gate dielectric layer and a metal gate electrode in the gate trench.

8. The method of claim 7, wherein residue is formed during the removal of the portion of the sacrificial semiconductor gate layer, and the residue comprises fluoride residue, chloride residue or bromide residue.

9. The method of claim 7, wherein the plasma cleaning operation comprises a hydrogen plasma cleaning operation.

10. The method of claim 7, wherein the removal of the remaining sacrificial semiconductor gate layer comprises a wet etching.

11. The method of claim 7, further comprising a fin structure disposed over the substrate and a dielectric layer sandwiched between the sacrificial semiconductor gate layer and the fin structure.

12. The method of claim 10, wherein the wet etching comprises an ammonium hydroxide ($NH_4OH$) solution.

13. The method of claim 11, wherein a portion of the dielectric layer is exposed to the gate trench after the removing of the remaining sacrificial semiconductor gate layer.

14. The method of claim 11, further comprising:
forming recesses in the fin structure at two sides of the sacrificial semiconductor gate layer; and
performing a cleaning operation with an HF-containing plasma, wherein the HF-containing plasma comprises HF and $NH_3$.

15. The method of claim 13, wherein the gate dielectric layer and the metal gate electrode are disposed over the dielectric layer.

16. The method of claim 13, further comprising:
removing the dielectric layer to expose the fin structure to the gate trench; and
disposing the gate dielectric layer and the metal gate electrode over the exposed fin structure in the gate trench.

17. The method of claim 14, further comprising forming a strained source/drain structure in each of the recesses after the performing of the cleaning operation.

18. A method for forming a semiconductor structure, comprising:
receiving a substrate having a fin structure, a semiconductor layer over the fin structure and a dielectric layer sandwiched between the semiconductor layer and the fin structure;
patterning the semiconductor layer to form a sacrificial gate layer covering a portion of the fin structure, wherein a portion of the dielectric layer is exposed;
performing a first cleaning operation to remove the exposed portion of the dielectric layer;
forming spacers over sidewalls of the sacrificial gate layer;
forming recesses in the fin structure at two sides of the sacrificial gate layer and a native oxide layer in the recesses;
performing a second cleaning operation with an HF-containing plasma to remove the native oxide layer, wherein the HF-containing plasma comprises HF and $NH_3$;
forming a strained source/drain structure in the recesses;
disposing a dielectric structure surrounding the sacrificial gate layer and the fin structure over the substrate;
removing a portion of the sacrificial gate layer to form a gate trench, wherein residue is formed in the gate trench;
performing a third cleaning operation to remove the residue from the gate trench;
removing the remaining sacrificial gate layer to deepen the gate trench; and
disposing a gate dielectric layer and a metal gate electrode in the gate trench.

19. The method of claim 18, wherein the first cleaning operation uses an HF solution.

20. The method of claim 18, wherein the third cleaning operation uses a hydrogen-containing plasma.

* * * * *